(12) United States Patent
Yanagisawa et al.

(10) Patent No.: US 11,278,967 B2
(45) Date of Patent: Mar. 22, 2022

(54) SURFACE-COATED CUTTING TOOL IN WHICH HARD COATING LAYER EXHIBITS EXCELLENT CHIPPING RESISTANCE AND PEELING RESISTANCE

(71) Applicant: MITSUBISHI MATERIALS CORPORATION, Tokyo (JP)

(72) Inventors: Kousuke Yanagisawa, Naka (JP); Sho Tatsuoka, Naka (JP); Kenichi Sato, Naka (JP); Shin Nishida, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 447 days.

(21) Appl. No.: 16/326,637

(22) PCT Filed: Mar. 29, 2017

(86) PCT No.: PCT/JP2017/012911
§ 371 (c)(1),
(2) Date: Feb. 19, 2019

(87) PCT Pub. No.: WO2018/042740
PCT Pub. Date: Mar. 8, 2018

(65) Prior Publication Data
US 2021/0220919 A1 Jul. 22, 2021

(30) Foreign Application Priority Data
Aug. 29, 2016 (JP) .............................. JP2016-166818

(51) Int. Cl.
*B23B 27/14* (2006.01)
*B23C 5/16* (2006.01)
(Continued)

(52) U.S. Cl.
CPC ................ *B23B 27/14* (2013.01); *B23C 5/16* (2013.01); *C23C 16/303* (2013.01); *C23C 16/36* (2013.01);
(Continued)

(58) Field of Classification Search
CPC ... B23B 27/14; B23B 27/148; B23B 2224/24; C23C 16/34; C23C 16/36; C23C 16/403; C23C 28/044
(Continued)

(56) References Cited

U.S. PATENT DOCUMENTS 5,985,427 A * 11/1999 Ueda ..................... C23C 16/403
51/307
7,887,935 B2 2/2011 Elkouby et al.
(Continued)

FOREIGN PATENT DOCUMENTS

CN 103764323 A 4/2014
EP 3150309 A1 4/2017
(Continued)

OTHER PUBLICATIONS

Chinese Office Action dated Jan. 15, 2020 for the corresponding Chinese Patent Application No. 201780052368.4.
(Continued)

*Primary Examiner* — Archene A Turner
(74) *Attorney, Agent, or Firm* — Leason Ellis LLP

(57) ABSTRACT

A surface-coated cutting tool has a hard coating layer including an upper layer α, an adhesion layer β, and a lower layer γ. The upper layer α is formed of an α-$Al_2O_3$ layer formed under low temperature conditions. The adhesion layer β includes a TiCN layer having a thickness of 0.5 μm or more in an outermost layer and contains 0.5 to 3 μm to a maximum depth of 0.5 μm toward the inside in a layer thickness direction of the TiCN layer from the interface
(Continued)

between the TiCN layer and the upper layer $\alpha$. The lower layer $\gamma$ is formed of $(Ti_{1-X}Al_X)(C_YN_{1-Y})$ of a single phase of a NaCl type face-centered cubic structure, in which an average content ratio $X_{avg}$ of Al and an average content ratio $Y_{avg}$ of C in this composition formula satisfy $0.60 \leq X_{avg} \leq 0.95$ and $0 \leq Y_{avg} \leq 0.005$.

6 Claims, 4 Drawing Sheets

(51) Int. Cl.
  *C23C 16/30* (2006.01)
  *C23C 16/36* (2006.01)
  *C23C 16/40* (2006.01)
  *C23C 28/04* (2006.01)

(52) U.S. Cl.
  CPC .......... *C23C 16/403* (2013.01); *C23C 28/042* (2013.01); *C23C 28/044* (2013.01); *B23B 2224/04* (2013.01); *B23B 2224/24* (2013.01); *B23B 2224/32* (2013.01)

(58) Field of Classification Search
  USPC .................. 407/119; 428/697, 698, 701, 702
  See application file for complete search history.

(56) References Cited

U.S. PATENT DOCUMENTS

| | | |
|---|---|---|
| 2004/0253446 A1 | 12/2004 | Ljungberg |
| 2007/0298281 A1 | 12/2007 | Andersson et al. |
| 2010/0323176 A1 | 12/2010 | Van Den et al. |
| 2011/0003126 A1* | 1/2011 | Van Den Berg ........ C23C 28/42 428/697 |
| 2014/0287210 A1 | 9/2014 | Tomita et al. |
| 2015/0158094 A1* | 6/2015 | Igarashi ................ C23C 28/044 428/216 |
| 2017/0021429 A1 | 1/2017 | Paseuth et al. |
| 2017/0029944 A1* | 2/2017 | Kubo ...................... C23C 10/28 |
| 2017/0165758 A1* | 6/2017 | Tatsuoka ............... B23B 27/148 |

FOREIGN PATENT DOCUMENTS

| | | |
|---|---|---|
| JP | 05-031602 A | 2/1993 |
| JP | 2004-308008 A | 11/2004 |
| JP | 2011-513594 A | 4/2011 |
| JP | 2011-516722 A | 5/2011 |
| JP | 2016-005862 A | 10/2011 |
| JP | 2013-063504 A | 4/2013 |
| JP | 2016-130343 A | 7/2013 |
| JP | 2015-085417 A | 5/2015 |
| JP | 2016-124099 A | 7/2016 |

OTHER PUBLICATIONS

Japanese Office Action dated Jan. 21, 2020 for the corresponding Japanese Patent Application No. 2016-166818.
Extended European Search Report dated Apr. 2, 2020 for the corresponding European Patent Application No. 17845751.1.
International Search Report dated Jun. 20, 2017 for the corresponding PCT International Patent Application No. PCT/JP2017/012911.

* cited by examiner

_US 11,278,967 B2_

SURFACE-COATED CUTTING TOOL IN WHICH HARD COATING LAYER EXHIBITS EXCELLENT CHIPPING RESISTANCE AND PEELING RESISTANCE

CROSS-REFERENCE TO RELATED PATENT APPLICATIONS

This application is a U.S. National Phase Application under 35 U.S.C. § 371 of International Patent Application No. PCT/JP2017/012911, filed Mar. 29, 2017, and claims the benefit of Japanese Patent Application No. 2016-166818, filed Aug. 29, 2016, all of which are incorporated herein by reference in their entireties. The International Application was published in Japanese on Mar. 8, 2018 as International Publication No. WO/2018/042740 under PCT Article 21(2).

FIELD OF THE INVENTION

The present invention relates to a surface-coated cutting tool (hereinafter, referred to as coated tool), in which a hard coating layer has excellent chipping resistance and peeling resistance during high-speed intermittent cutting of cast iron, stainless steel, or the like during which high-temperature heat is generated and intermittent and impact high loads are exerted on a cutting edge, and excellent cutting performance is thus exhibited during long-term use.

BACKGROUND OF THE INVENTION

Hitherto, in general, coated tools in which the surfaces of tool bodies made of tungsten carbide (hereinafter, referred to as WC)-based cemented carbide, titanium carbonitride (hereinafter, referred to as TiCN)-based cermet, or a cubic boron nitride (hereinafter, referred to as cBN)-based ultra-high-pressure sintered body (hereinafter, collectively referred to as a tool body) are coated with a Ti—Al-based complex nitride layer as a hard coating layer through a physical vapor deposition method are known, and it is known that these coated tools exhibit excellent wear resistance.

However, although the coated tool coated with the Ti—Al-based complex nitride layer in the related art has relatively excellent wear resistance, in a case of using the coated tool under high-speed intermittent cutting conditions, abnormal wear such as chipping and peeling easily occurs. Therefore, various suggestions for an improvement in the hard coating layer have been made.

For example, Japanese Unexamined Publication No. 2011-516722 (Translation of PCT Application) describes that by performing chemical vapor deposition in a mixed reaction gas of $TiCl_4$, $AlCl_3$, and $NH_3$ in a temperature range of 650° C. to 900° C., a $(Ti_{1-x}Al_x)N$ layer in which the value of the content ratio x of Al is 0.65 to 0.95 can be deposited. However, this literature is aimed at further coating the $(Ti_{1-x}Al_x)N$ layer with an $Al_2O_3$ layer and thus improving a heat insulation effect, and the effect of the formation of the $(Ti_{1-x}Al_x)N$ layer in which the value of the content ratio x of Al is increased to 0.65 to 0.95 on the cutting performance is not clarified.

In addition, for example, Japanese Unexamined Publication No. 2011-513594 (Translation of PCT Application) suggests that the heat resistance and fatigue strength of a coated tool are improved by coating the outside of a TiCN layer and an $Al_2O_3$ layer as inner layers with a $(Ti_{1-x}Al_x)N$ layer (here, x is 0.65 to 0.90 in atomic ratio) having a cubic structure or a cubic structure including a hexagonal structure as an outer layer using a chemical vapor deposition method, and applying a compressive stress of 100 to 1100 MPa to the outer layer.

In addition, Japanese Unexamined Publication No. 2004-308008 describes a method of depositing a crystalline $\alpha$-$Al_2O_3$ layer on a cutting tool insert through chemical vapor deposition at a low temperature (625° C. to 800° C.) and a cutting tool produced according to the method. The method described in Japanese Unexamined Publication No. 2004-308008 suggests the cutting tool insert produced by a step of first depositing a layer of $TiC_xN_yO_z$ satisfying $X+Y+Z \geq 1$ and $Z>0$ (preferably $Z>0.2$) into 0.1 to 1.5 μm, a step of thereafter treating the layer in a gas mixture containing 0.5 to 3 vol % of $O_2$, preferably $CO_2$ and $H_2$ or $O_2$ and $H_2$, arbitrarily in the presence of 0.5 to 6 vol % of HCl at 625° C. to 1000° C. for a short period of time of about 0.5 to 4 minutes, and a step of thereafter depositing $Al_2O_3$ layer by bringing the treated layer into contact with a gas mixture containing 2 to 10 vol % of $AlCl_3$ and 16 to 40 vol % of $CO_2$ in $H_2$ and 0.8 to 2 vol % of a sulfur-containing agent (preferably $H_2S$) at a treatment pressure of 40 to 300 millibars and a temperature of 625° C. to 800° C.

Technical Problem

There has been a strong demand for power saving and energy saving during cutting in recent years. In accordance with this, there is a trend toward a further increase in speed and efficiency during cutting. Therefore, abnormal damage resistance such as chipping resistance, fracture resistance, and peeling resistance is further required for a coated tool, and excellent wear resistance is required during long-term use.

In the $(Ti_{1-x}Al_x)N$ layer deposited through the chemical vapor deposition method suggested in Japanese Unexamined Publication No. 2011-516722 (Translation of PCT Application), since the content ratio x of Al can be increased and the cubic structure can be formed, a hard coating layer having a predetermined hardness is obtained. However, when film formation is performed at a film forming temperature of about 1000° C. of typical conditions in order to obtain the $\alpha$-$Al_2O_3$ layer having excellent wear resistance during formation of an upper $Al_2O_3$ layer, phase separation of AlN having a hexagonal structure occurs in the $(Ti_{1-x}Al_x)N$ layer. On the other hand, in a case where the $\alpha$-$Al_2O_3$ layer is formed on the surface of the $(Ti_{1-x}Al_x)N$ layer in a temperature range as low as 700° C. to 900° C., although phase separation of the AlN phase having a hexagonal structure does not occur in the $(Ti_{1-x}Al_x)N$ layer, amorphous $Al_2O_3$ is formed on the outermost surface of the $(Ti_{1-x}Al_x)N$ layer, and there is a problem in that the adhesion strength between the $(Ti_{1-x}Al_x)N$ layer and the $\alpha$-$Al_2O_3$ layer is not sufficient.

In addition, although the coated tool suggested in Japanese Unexamined Publication No. 2011-513594 (Translation of PCT Application) has predetermined heat resistance and cycle fatigue strength, the coated tool is inferior in wear resistance and toughness. Therefore, in a case where the coated tool is provided for intermittent cutting of cast iron or the like, there are problems in that abnormal damage such as chipping, fractures, and peeling easily occurs, and it cannot be said that satisfactory cutting performance is exhibited.

In addition, in a case where the coated tool suggested in Japanese Unexamined Publication No. 2004-308008 is provided for intermittent cutting accompanied by mechanical impacts, the hardness of an intermediate layer is insufficient, and there are problems in that abnormal damage such as peeling, chipping and fracture of film interface easily occur, and it cannot be said that satisfactory cutting performance is exhibited.

An object of the present invention is to provide a coated tool which has excellent chipping resistance and peeling resistance and exhibits excellent wear resistance during long-term use even in a case of being provided for high-speed intermittent cutting of cast iron, stainless steel, or the like during which intermittent and impact high loads are exerted on a cutting edge.

SUMMARY OF THE INVENTION

Solution to Problem

Therefore, from the above-described viewpoints, the inventors intensively studied to improve the chipping resistance and peeling resistance of a coated tool in which a hard coating layer including at least, as a lower layer, a layer of a complex nitride or complex carbonitride of Ti and Al (hereinafter, sometimes referred to as "(Ti,Al) (C,N)" or "$(Ti_{1-x}Al_x)(C_yN_{1-y})$") and as an upper layer, an $Al_2O_3$ layer having an α-type crystal structure (hereinafter, sometimes simply referred to as "α-$Al_2O_3$ layer") is deposited through chemical vapor deposition. As a result, the following knowledge was obtained.

That is, the inventors found that in a case where an α-$Al_2O_3$ layer is deposited directly on a (Ti,Al)(C,N) layer which is a lower layer under typical conditions, since the (Ti,Al)(C,N) layer having a cubic structure is a metastable phase, phase separation of AlN having a hexagonal structure occurs in the (Ti,Al)(C,N) layer at about 1000° C. as the film forming temperature of the α-$Al_2O_3$ layer, and a sufficient hardness for the (Ti,Al)(C,N) layer is not obtained, whereas, in a case where an α-$Al_2O_3$ layer is formed on the surface of a (Ti,Al) (C,N) layer at a temperature range as low as 700° C. to 900° C., although phase separation of AlN having a hexagonal structure does not occur in the (Ti,Al)(C,N) layer, amorphous $Al_2O_3$ is formed on the outermost surface of the (Ti,Al)(C,N) layer, and the adhesion strength between the (Ti,Al)(C,N) layer and the α-$Al_2O_3$ layer is not sufficient.

In addition, it was found that even in a case where a TiCN layer is formed between the (Ti,Al)(C,N) layer of the lower layer and the α-$Al_2O_3$ layer under typical film forming temperature conditions in order to increase the adhesion strength between the two layers, phase separation of AlN having a hexagonal structure occurs in the (Ti,Al)(C,N) layer of the lower layer due to the film forming temperature of the TiCN layer at about 1000° C., and as a result, a sufficient hardness for the entire hard coating layer is not obtained.

Therefore, the inventors further conducted examinations to improve the adhesion strength between the (Ti,Al)(C,N) layer and the α-$Al_2O_3$ layer, and found that in a case where a cubic (Ti,Al)(C,N) layer is formed as a lower layer, a TiCN layer as an adhesion layer is formed thereon under relatively low temperature film forming conditions (hereinafter, a TiCN layer formed under relatively low temperature film forming conditions is referred to as a "TiCN layer"), a TiCN layer containing oxygen (hereinafter, sometimes referred to as an "oxygen-containing TiCN layer") is formed in the vicinity of the surface of the TiCN layer being in contact with the interface with the α-$Al_2O_3$ layer in order to improve the adhesion strength at the interface between the TiCN layer and the α-$Al_2O_3$ layer. When the α-$Al_2O_3$ layer, which is an upper layer, is formed under low temperature conditions, the occurrence of phase separation of a hexagonal AlN phase in the (Ti,Al)(C,N) layer can be suppressed and the hardness of the layer can be maintained at the same time. Furthermore, the adhesion strength among the lower layer, the adhesion layer, and the upper layer can be increased.

Therefore, the coated tool of the present invention provided with a hard coating layer constituted by the lower layer, the adhesion layer, and the upper layer has excellent chipping resistance and peeling resistance and exhibits excellent wear resistance during long-term use even in a case of being provided for high-speed intermittent cutting of cast iron, stainless steel, or the like during which intermittent and impact high loads are exerted on a cutting edge.

The present invention is made based on the above-described knowledge and is characterized by including "(1) A surface-coated cutting tool in which a hard coating layer including at least three layers of an upper layer α, an adhesion layer β, and a lower layer γ is formed on a surface of a tool body made of any of tungsten carbide-based cemented carbide, titanium carbonitride-based cermet, or a cubic boron nitride-based ultrahigh-pressure sintered body, in which (a) the upper layer α is formed of an $Al_2O_3$ layer having an α-type crystal structure with an average layer thickness of 1.0 to 10 μm, (b) the adhesion layer β has a total average layer thickness of 0.5 to 10.0 μm, and an outermost layer of the adhesion layer β being in contact with an interface with the upper layer α includes at least a TiCN layer having a layer thickness of at least 0.5 μm or more, (c) oxygen is contained to a maximum depth of 0.5 μm toward the inside in a layer thickness direction of the TiCN layer from the interface with the upper layer α, and an average oxygen content in the depth area is 0.5 to 3 at % of a total content of Ti, C, N, and O contained in the depth area, (d) the lower layer γ is formed of a layer of a complex nitride or complex carbonitride of Ti and Al having an average layer thickness of 1.0 to 20 μm, (e) the layer of a complex nitride or complex carbonitride of Ti and Al is formed of a single phase of a NaCl type face-centered cubic structure, and (f) in a case where an average composition of the layer of a complex nitride or complex carbonitride of Ti and Al is expressed by $(Ti_{1-X}Al_X)(C_YN_{1-Y})$, an average content ratio $X_{avg}$ of Al to a total amount of Ti and Al and an average content ratio $Y_{avg}$ of C to a total amount of C and N (here, each of $X_{avg}$ and $Y_{avg}$ is in atomic ratio) respectively satisfy $0.60 \leq X_{avg} \leq 0.95$ and $0 \leq Y_{avg} \leq 0.005$.

(2) The surface-coated cutting tool according to (1), in which the upper layer α contains 0.05 to 0.5 at % of chlorine.

(3) The surface-coated cutting tool according to (1) or (2), in which the average content ratio $X_{avg}$ of Al to the total amount of Ti and Al of the layer of a complex nitride or complex carbonitride of Ti and Al in the lower layer γ is $0.70 \leq X_{avg} \leq 0.95$.

(4) The surface-coated cutting tool according to any one of (1) to (3), in which the adhesion layer β further includes one or two or more layers selected from a Ti carbide layer, a Ti nitride layer, a Ti carbonitride layer, a Ti oxycarbide layer, and a Ti oxycarbonitride layer.

(5) The surface-coated cutting tool according to any one of (1) to (4), in which the adhesion layer further includes a layer of a complex nitride or complex carbonitride of Ti and Al, an average layer thickness $L_{avg}$ (μm) of the layer of a complex nitride or complex carbonitride of Ti and Al satisfies $0.30 \leq L_{avg} \leq 5.0$, and when an average content ratio $X_{\beta avg}$ of Al to a total amount of Ti and Al is obtained in each of sections obtained by dividing the layer of a complex nitride or complex carbonitride of Ti and Al by $[L_{avg}]+2$, $X_{\beta avg} < X_{avg}$ is satisfied in each of the sections, and $X_{\beta avg}$ of a section closer to a surface side is equal to or smaller than $X_{\beta avg}$ of a section closer to a body side.

(6) The surface-coated cutting tool according to any one of (1) to (5), in which, in a case where the layer of a complex nitride or complex carbonitride of Ti and Al in the lower layer γ is analyzed in an arbitrary section perpendicular to the surface of the tool body, crystal grains having a NaCl type face-centered cubic structure, which has a periodic composition variation of Ti and Al, are present, and at least the crystal grains, in which an angle between a direction in which a period of the periodic composition variation of Ti and Al is minimized and a surface perpendicular to the surface of the tool body is 30 degrees or less, are present.

(7) The surface-coated cutting tool according to any one of (1) to (6), in which a lowermost layer δ is present between the tool body and the lower layer γ, and the lowermost layer δ is formed of one or two or more layers selected from a layer of a complex nitride or complex carbonitride of Ti and Al with a different composition from the lower layer γ, a Ti carbide layer, a Ti nitride layer, a Ti carbonitride layer, a Ti oxycarbide layer, and a Ti oxycarbonitride layer and has a total average layer thickness of 0.1 to 10 μm."

The present invention will be described below in detail.

First, examples of the layer structure of the hard coating layer of the coated tool of the present invention will be described with reference to the drawings.

FIGS. 1 to 5 illustrate several specific examples of the layer structure of the hard coating layer of the coated tool of the present invention.

FIG. 1 illustrates an example of the layer structure of the hard coating layer in which the upper layer α is formed of an α-Al$_2$O$_3$ layer, the adhesion layer β is formed of only a TiCN layer (with a layer thickness of 0.5 μm) containing a predetermined amount of oxygen, and the lower layer γ is formed of a (Ti,Al)(C,N) layer.

In coated tools illustrated in FIGS. 2 to 4, the adhesion layer β shows various aspects while the upper layer α is the α-Al$_2$O$_3$ layer and the lower layer γ is the (Ti,Al)(C,N) layer.

The adhesion layer β illustrated in FIG. 2 is constituted by an oxygen-containing TiCN layer in which oxygen is contained to a maximum depth of 0.5 μm toward the inside in the layer thickness direction of the TiCN layer from the interface with the upper layer α and the average oxygen content in the depth area is 0.5 to 3 at % of the total content of Ti, C, N, and O contained in the depth area, and the typical TiCN layer into which oxygen is not intentionally introduced.

In the form illustrated in FIG. 3, the adhesion layer β is formed of an oxygen-containing TiCN layer, a TiCN layer, and a Ti compound layer (one or two or more Ti compound layers selected from a TiC layer, a TiN layer, a TiCN layer, a TiCO layer, and a TiCNO layer).

In the form illustrated in FIG. 4, the adhesion layer β is formed of an oxygen-containing TiCN layer, a TiCN layer, and a (Ti,Al)(C,N) layer.

However, in the (Ti,Al)(C,N) layer which is the constituent layer of the adhesion layer β, the average layer thickness $L_{avg}$ (μm) in the layer satisfies $0.30 \leq L_{avg} \leq 5.0$, and it is necessary that when the average content ratio $X_{\beta avg}$ of Al to the total amount of Ti and Al is obtained in each of sections obtained by dividing the layer of a complex nitride or complex carbonitride of Ti and Al by $[L_{avg}]+2$, $X_{\beta avg} < X_{avg}$ is satisfied in each of the sections, and $X_{\beta avg}$ of the section closer to the surface side is equal to or smaller than $X_{\beta avg}$ of the section closer to the body side. In this sense, the (Ti,Al)(C,N) layer which is the constituent layer of the adhesion layer β in FIG. 4 is indicated by a "(Ti,Al)(C,N)* layer".

Here, $[L_{avg}]$ represents the Gaussian symbol. [x] is a mathematical symbol representing the largest integer that does not exceed x, and when [x]=n, x is defined as $n \leq x < n+1$ (here, n is an integer).

The reason why $X_{\beta avg} < X_{avg}$ is satisfied in each of the sections and $X_{\beta avg}$ of the section closer to the surface side is equal to or smaller than $X_{\beta avg}$ of the section closer to the body side is that by relieving the strain in the film surface direction while suppressing a sudden change in the lattice strain between the lower layer γ and the TiCN layer or the Ti compound layer (one or two or more Ti compound layers selected from a TiC layer, a TiN layer, a TiCN layer, a TiCO layer, and a TiCNO layer), the adhesion strength at the interface is secured, and the chipping resistance and peeling resistance are improved.

The content ratio of Al in the adhesion layer β formed of the (Ti,Al)(C,N) layer may be a value that gradually decreases continuously or discontinuously in the layer thickness direction from the lower layer γ side to the upper layer α side, and may satisfy $X_{\beta avg} < X_{avg}$ in each of the sections and further satisfy the relationship in which $X_{\beta avg}$ of the section closer to the surface side is equal to or smaller than $X_{\beta avg}$ of the section closer to the body side.

FIG. 5 corresponds to a form in which the lowermost layer δ is further formed to be interposed between the tool body and the lower layer γ in the layer structure of the aspect illustrated in FIG. 4.

The lowermost layer δ is constituted by one or two or more layers selected from a (Ti,Al)(C,N) layer having a different composition from the lower layer γ, a TiC layer, a TiN layer, a TiCN layer, a TiCO layer, and a TiCNO layer, and thus can further improve the adhesion strength between the tool body and the lower layer γ.

In addition, for example, when a (Ti,Al)(C,N) layer is formed as the lowermost layer δ and the average content ratio $X_{\beta avg}$ of Al to the total amount of Ti and Al is obtained in each of sections obtained by dividing the layer by $[L_{avg}]+2$, it is necessary that $X_{\delta avg} < X_{avg}$ is satisfied in each of the sections, and $X_{\delta avg}$ of the section closer to the surface side is equal to or greater than $X_{\delta avg}$ of the section closer to the body side. However, the content ratio of Al in the lowermost layer δ formed of the (Ti,Al)(C,N) layer may be a value that gradually decreases continuously or discontinuously in the layer thickness direction from the tool body side to the lower layer γ side, and may satisfy $X_{\delta avg} < X_{avg}$ in each of the sections and further satisfy the relationship in which $X_{\delta avg}$ of the section closer to the surface side is equal to or smaller than $X_{\delta avg}$ of the section closer to the body side.

By adopting such a composition gradient structure of Al, the adhesion strength between the tool body and the lower layer γ can be further increased without lowering the overall hardness of the hard coating layer.

Next, each layer of the hard coating layer of the coated tool of the present invention will be described.

Upper layer α:

The upper layer α of the present invention is formed of the α-Al$_2$O$_3$ layer and thus exhibits excellent high-temperature hardness and high-temperature oxidation resistance. However, in a case where the average layer thickness of the upper layer α is less than 1.0 μm, excellent wear resistance cannot be exhibited over a long period of time. On the other hand, in a case where the average layer thickness of the upper layer α exceeds 10 µm, chipping easily occurs. Therefore, the average layer thickness of the upper layer α is set to 1.0 µm to 10 µm.

As described above, in order to prevent phase separation of a hexagonal AlN phase in the lower layer γ formed of the (Ti,Al) (C,N) layer, it is preferable to form the upper layer α at a relatively low temperature (800° C. to 900° C.) compared to a film forming temperature in the related art.

In a case of forming the upper layer α at a relatively low temperature, it is desirable to perform chemical vapor deposition divided into two stages including a stage of initial nucleation of α-$Al_2O_3$ and a stage of growth of α-$Al_2O_3$ for the formation of the α-$Al_2O_3$ layer.

Specific chemical vapor deposition conditions of the upper layer α formed of the α-$Al_2O_3$ layer are, for example, as follows.

<α-$Al_2O_3$ Initial Nucleation Conditions>
Reaction gas composition (vol %): $AlCl_3$ 1% to 3%, $CO_2$ 1% to 5%, HCl 0.3% to 1.0%, remainder $H_2$
Reaction atmosphere pressure: 5.0 to 15.0 kPa
Reaction atmosphere temperature: 800° C. to 900° C.
<α-$Al_2O_3$ Growth Conditions>
Reaction gas composition (vol %): $AlCl_3$ 1.5% to 5.0%, $CO_2$ 2% to 8%, HCl 3% to 8%, $H_2S$ 0.5% to 1.0%, remainder $H_2$
Reaction atmosphere pressure: 5.0 to 15.0 kPa
Reaction atmosphere temperature: 800° C. to 900° C.

Through the chemical vapor deposition divided into the two stages including the stage of initial nucleation of α-$Al_2O_3$ and the stage of growth of α-$Al_2O_3$, the upper layer α formed of the α-$Al_2O_3$ layer can be formed.

In addition, in a case of forming the α-$Al_2O_3$ layer at a relatively low temperature (800° C. to 900° C.), chlorine which is a reaction gas component is incorporated into the layer.

The incorporation of chlorine into the α-$Al_2O_3$ layer is not an essential requirement. However, when the chlorine content becomes 0.05 at % or more, the α-$Al_2O_3$ layer has lubricity and absorbs mechanical impacts in a case of being provided for intermittent cutting during which mechanical impacts are applied to an edge tip, thereby exhibiting an effect of suppressing abnormal damage such as chipping. On the other hand, when the chlorine content exceeds 0.5 at %, such an excessive content causes deterioration of the wear resistance of the α-$Al_2O_3$ layer.

Therefore, it is desirable that the chlorine content in the upper layer α formed of the α-$Al_2O_3$ layer is set to 0.05 to 0.5 at %.

Adhesion Layer β:

As described above, the adhesion layer β needs to have a total average layer thickness of 0.5 to 10.0 µm, and the layer being in contact with the interface with the upper layer α needs to be at least an oxygen-containing TiCN layer.

When the total average layer thickness of the adhesion layer β is less than 0.5 µm, the adhesion between the lower layer γ and the upper layer α cannot be secured. On the other hand, when the total average layer thickness exceeds 10.0 µm, thermoplastic deformation easily occurs during high-speed heavy cutting and intermittent cutting during which the edge tip that reaches a high temperature, and uneven wear and corresponding abnormal damage such as chipping easily occurs. Therefore, the total average layer thickness of the adhesion layer β is set to 0.5 to 10.0 µm.

Oxygen-Containing TiCN Layer in Adhesion Layer β:

In the adhesion layer β, the oxygen-containing TiCN layer which is in contact with the interface with the upper layer α and contains oxygen to a maximum depth of 0.5 µm toward the inside in the layer thickness direction of the TiCN layer is formed, and the average oxygen content in the depth area is 0.5 to 3 at % of the total content of Ti, C, N, and O contained in the depth area.

When the thickness of the oxygen-containing TiCN layer (in other words, the depth of an oxygen-containing area of the adhesion layer β being in contact with the interface with the upper layer α) exceeds 0.5 µm, the structure morphology of the outermost surface of the oxygen-containing TiCN layer converts from a columnar structure to a granular structure, so that thermoplastic deformation easily occurs and uneven wear and corresponding abnormal damage such as chipping easily occurs. Therefore, the maximum thickness of the oxygen-containing TiCN layer (the maximum depth of the oxygen-containing area of the adhesion layer β) is set to 0.5 µm.

When the average oxygen content in the oxygen-containing TiCN layer is less than 0.5 at %, a sufficient adhesion strength with the upper layer α formed at relatively low temperature conditions cannot be expected. When the average oxygen content exceeds 3 at %, the high-temperature strength and wear resistance of α-$Al_2O_3$ forming the upper layer α decrease, and sufficient cutting performance cannot be exhibited.

Therefore, in the adhesion layer β, the layer thickness of the oxygen-containing TiCN layer formed in contact with the upper layer α is set to 0.5 µm at the maximum, and the average oxygen content in the oxygen-containing TiCN layer is set to 0.5 to 3 at %.

The adhesion layer β may further include, in addition to the oxygen-containing TiCN layer, as illustrated in FIGS. 2 to 5, one or two or more layers selected from a (Ti,Al)(C,N) layer, a Ti carbide layer, a Ti nitride layer, a Ti carbonitride layer, a Ti oxycarbide layer, and a Ti oxycarbonitride layer.

As illustrated in FIG. 3, in a case where the adhesion layer β includes a Ti compound layer of one or two or more layers of a Ti carbide layer, a Ti nitride layer, a Ti carbonitride layer, a Ti oxycarbide layer, and a Ti oxycarbonitride layer, the adhesion between the adhesion layer β and the lower layer γ is improved.

In addition, as illustrated as "(Ti,Al)(C,N)*" in FIGS. 4 and 5, in a case where the adhesion layer β includes a (Ti,Al)(C,N) layer, the hardness of the adhesion layer β is also improved, and the wear resistance of the entire hard coating layer is improved.

However, in the (Ti,Al)(C,N) layer which is the constituent layer of the adhesion layer β, the average layer thickness $L_{avg}$ (µm) in the layer satisfies $0.30 \leq L_{avg} \leq 5.0$, and an average content ratio $X_{\beta avg}$ of Al to the total amount of Ti and Al is obtained in each of sections obtained by dividing the layer of a complex nitride or complex carbonitride of Ti and Al by $[L_{avg}]+2$, $X_{\beta avg} < X_{avg}$ is satisfied in each of the sections, and $X_{\beta avg}$ of the section closer to the surface side is equal to or smaller than $X_{\beta avg}$ of the section closer to the body side.

This is because as in the case of the (Ti,Al)(C,N) layer in the lower layer γ, the (Ti,Al)(C,N) layer of the adhesion layer β is also formed as a single phase of a cubic structure, secures the hardness of both the lower layer γ and the adhesion layer β, and thus improves the wear resistance of the entire hard coating layer.

The content ratio of Al in the adhesion layer β formed of the (Ti,Al)(C,N) layer is not necessarily constant along the layer thickness direction and may be a value that gradually decreases continuously or discontinuously in the layer thickness direction from the lower layer γ side to the upper layer α side.

Film Formation of Adhesion Layer β:

As in the case of the upper layer α, the adhesion layer β needs to be formed under low temperature conditions in which thermal effects on the lower layer γ are considered so as not to cause the lower layer γ to cause phase separation and generate a hexagonal AlN phase.

As such film forming conditions, for example, when a TiCN layer is formed, the TiCN layer can be formed by chemical vapor deposition under conditions of Reaction gas composition (vol %): $TiCl_4$ 2.0% to 6.0%, $C_2H_4$ 2.0% to 3.0%, $NH_3$ 0.5% to 1.0%, $N_2$ 10.0% to 20.0%, remainder $H_2$ Reaction atmosphere temperature: 800° C. to 900° C.

Reaction atmosphere pressure: 6 to 10 kPa.

Furthermore, regarding film formation of the oxygen-containing TiCN layer being in contact with the upper layer α, in the film forming conditions of the TiCN layer, the oxygen-containing TiCN layer can be formed by performing chemical vapor deposition under conditions of a reaction atmosphere temperature of 800° C. to 900° C. and a reaction atmosphere pressure of 6 to 10 kPa in a reaction gas atmosphere obtained by adding $CO_2$ gas in an amount of 1 to 5 vol % with respect to the total reaction gas amount in the composition.

Lower Layer γ:

The (Ti,Al)(C,N) layer illustrated as the lower layer γ in FIGS. 1 to 5 is a layer which is formed of a single phase of a NaCl type face-centered cubic structure in which a hexagonal AlN phase is not formed because each of the upper layer α and the adhesion layer β is formed under low temperature conditions, and maintains high-temperature hardness.

The lower layer γ has an average layer thickness of 1.0 to 20 μm. When the average layer thickness is less than 1.0 μm, excellent wear resistance cannot be exhibited during long-term use. On the other hand, when the average layer thickness exceeds 20 μm, chipping easily occurs.

In addition, since both the adhesion layer β and the upper layer α are formed at low temperature, the lower layer γ is formed of the single phase of a NaCl type face-centered cubic structure.

In a case where the average composition of the lower layer γ formed of the (Ti,Al)(C,N) layer is expressed by $(Ti_{1-X}Al_X)(C_YN_{1-Y})$, it is necessary that the average content ratio $X_{avg}$ of Al to the total amount of Ti and Al and the average content ratio $Y_{avg}$ of C to the total amount of C and N (here, each of $X_{avg}$ and $Y_{avg}$ is in atomic ratio) respectively satisfy $0.60 \leq X_{avg} \leq 0.95$ and $0 \leq Y_{avg} \leq 0.005$.

This is because when the average content ratio $X_{avg}$ of Al is less than 0.60, the hardness of the layer is insufficient, whereas, when the average content ratio exceeds 0.95, it is difficult to maintain a NaCl type face-centered cubic structure, which is important for securing hardness, and an AlN phase having a hexagonal structure with low hardness is formed.

In addition, the average content ratio $X_{avg}$ of Al is preferably $0.7 \leq X_{avg} \leq 0.95$, and this is because hardness close to the maximum hardness can be obtained when the average content ratio $X_{avg}$ of Al is 0.7 or more.

In addition, the average content ratio $Y_{avg}$ of C to the total amount of C and N is a small amount in a range of $0 \leq Y_{avg} \leq 0.005$, the adhesion to the tool body or the adhesion layer β (or the lowermost layer δ) is improved, and the lubricity are improved, thereby relieving impacts during cutting. As a result, the fracture resistance and chipping resistance of the entire hard coating layer are improved.

On the other hand, when the average content ratio $Y_{avg}$ of C is outside the range of $0 \leq Y_{avg} \leq 0.005$, the toughness of the (Ti,Al)(C,N) layer decreases, and the fracture resistance and chipping resistance decrease, which is not preferable.

Therefore, the average content ratio $Y_{avg}$ of C is determined as $0 \leq Y_{avg} \leq 0.005$.

It is desirable that in a case where the (Ti,Al)(C,N) layer in the lower layer γ is analyzed in an arbitrary section perpendicular to the surface of the tool body, crystal grains having a NaCl type face-centered cubic structure, which has a periodic composition variation of Ti and Al, are present, and at least the crystal grains, in which the angle between a direction in which the period of the periodic composition variation of Ti and Al is minimized and a direction perpendicular to the surface of the tool body is 30 degrees or less, are present.

This is due to the following reasons.

In the present invention, during the film formation of the (Ti,Al)(C,N) layer, by supplying a reaction gas group A and a gas group B so that the times at which the gas group A and the gas group B arrive at the surface of the tool body are different from each other, a difference in concentration between Ti and Al can be locally formed in the crystal grains, and the crystal grains are stabilized in the direction in which the angle between the direction of the periodic concentration variation and the surface perpendicular to the surface of the tool body is 30 degrees or less.

The periodic concentration variation in the direction at an angle of 30 degrees or less with respect to the surface perpendicular to the surface of the tool body suppresses the development of cracks in a direction perpendicular to the body caused by the shear force exerted on the surface where wear progresses during cutting, resulting in an improvement in toughness. However, when the angle between the direction of the periodic concentration variation and the surface perpendicular to the surface of the tool body exceeds 30 degrees, the effect of suppressing the development of cracks in the direction perpendicular to the body cannot be expected, and the effect of improving the toughness cannot also be expected. It is assumed that the effect of suppressing the development of cracks is exhibited due to bending or refraction in the direction of development at the boundary with different Ti and Al concentrations.

Therefore, in the present invention, it is desirable that the crystal grains having a NaCl type face-centered cubic structure in which the direction in which the period of the periodic composition variation in the crystal grains is minimized and the surface perpendicular to the surface of the tool body is 30 degrees or less are present.

The presence of the crystal grains having a NaCl type face-centered cubic structure in which the angle between the direction of the periodic concentration variation in the crystal grains and the surface perpendicular to the surface of the tool body is 30 degrees or less can be measured and confirmed by obtaining a contrast variation of an image corresponding to the periodic concentration variation of Ti and Al in an image of 1 μm × 1 μm using a transmission electron microscope or obtaining the direction of the concentration variation of each crystal grain in an area having the periodic concentration variation of Ti and Al confirmed by energy-dispersive X-ray spectroscopy (EDS), and extracting crystal grains in which the angle between the direction of the periodic concentration variation and the surface of the tool body is 30 degrees or less therefrom.

Film Formation of Lower Layer γ:

Specifically, the lower layer γ can be formed, for example, by a thermal CVD method using $NH_3$ of film forming conditions described below.

Reaction gas composition (vol %):
Gas group A: $NH_3$: 2.0% to 3.0%, $H_2$: 65% to 75%
Gas group B: $AlCl_3$: 0.6% to 0.9%, $TiCl_4$: 0.1% to 0.4%, $N_2$: 0.0% to 12.0%, $C_2H_4$: 0% to 0.5%, $H_2$: remainder
Reaction atmosphere pressure: 4.5 to 5.0 kPa
Reaction atmosphere temperature: 700° C. to 900° C.
Supply period of gas group A and gas group B: 1 to 5 seconds
Gas supply time per one period: 0.15 to 0.25 seconds
Phase difference between supply of gas group A and supply of gas group B: 0.10 to 0.20 seconds.

Lowermost Layer δ:

The lowermost layer δ is present between the tool body and the lower layer γ, and the lowermost layer δ is formed of one or two or more layers selected from a (Ti,Al)(C,N) layer with a different composition from the lower layer γ, a Ti carbide layer, a Ti nitride layer, a Ti carbonitride layer, a Ti oxycarbide layer, and a Ti oxycarbonitride layer and has a total average layer thickness of 0.1 to 10 μm. In a case where the lowermost layer δ is formed with a total average layer thickness of 0.1 to 10 μm, an effect of further increasing the adhesion strength between the tool body and the lower layer γ is achieved.

In a case where the (Ti,Al)(C,N) layer with a different composition from the lower layer γ is formed as the lowermost layer δ, when the average content ratio $X_{\delta avg}$ of Al to the total amount of Ti and Al is obtained in each of sections obtained by dividing the (Ti,Al)(C,N) layer as the lowermost layer δ by $[L_{avg}]+2$, it is necessary that $X_{\delta avg} < X_{avg}$ is satisfied in each of the sections, and $X_{\delta avg}$ of the section closer to the surface side is equal to or greater than $X_{\delta avg}$ of the section closer to the body side.

This is because as in the case of the (Ti,Al)(C,N) layer in the adhesion layer β, the (Ti,Al)(C,N) layer in the lowermost layer δ is formed as a single phase of a cubic structure, secures the adhesion between the tool body and the lower layer γ, and thus improves the chipping resistance and peeling resistance of the entire hard coating layer.

The content ratio of Al in the lowermost layer δ formed of the (Ti,Al)(C,N) layer is not necessarily constant along the layer thickness direction and may be a value that gradually increases continuously or discontinuously in the layer thickness direction from the tool body side to the lower layer γ side. In this case, superior adhesion strength between the tool body and the lower layer γ during long-term use can be secured.

Advantageous Effects of Invention

In the surface-coated cutting tool provided with the hard coating layer on the surface of the tool body in the present invention, the hard coating layer includes at least the lower layer γ formed of the (Ti,Al)(C,N) layer of the NaCl type face-centered cubic structure single phase formed by the chemical vapor deposition method, the adhesion layer β formed thereon under low temperature conditions (800° C. to 900° C.), and the upper layer α formed of the α-$Al_2O_3$ layer thereon under low temperature conditions (800° C. to 900° C.), and the adhesion layer β and the upper layer α are formed under the film forming condition at relatively low temperatures (800° C. to 900° C.), whereby the lower layer γ has a single phase of an NaCl type cubic structure, the occurrence of phase separation of a hexagonal AlN phase can be suppressed, and high hardness can be maintained.

Furthermore, since the oxygen-containing TiCN layer having excellent adhesion to the upper layer α is formed between the upper layer α and the adhesion layer β formed under low temperature conditions, the occurrence of chipping and the occurrence of peeling are suppressed.

Therefore, the coated tool of the present invention provided with the hard coating layer exhibits excellent wear resistance during long-term use without the occurrence of chipping, peeling, and the like even in a case of being provided for high-speed intermittent cutting during which intermittent and impact loads are exerted on a cutting edge.

Moreover, in the lower layer γ of the hard coating layer, in a case where the crystal grains having a NaCl type face-centered cubic structure in which the periodic composition variation of Ti and Al is present and the angle between the direction in which the period of the periodic composition variation is minimized and the surface perpendicular to the surface of the tool body is 30 degrees or less are present, the development of cracks in the direction perpendicular to the tool body caused by the shear force exerted on the surface where wear progresses during cutting is suppressed, whereby the toughness is improved and the chipping resistance and peeling resistance are further improved.

BRIEF DESCRIPTION OF THE DRAWINGS

These and other features and advantages of the present invention will become more readily appreciated when considered in connection with the following detailed description and appended drawing(s), wherein like designations denote like elements in the various views, and wherein.

DETAILED DESCRIPTION OF THE INVENTION

Figure 1:
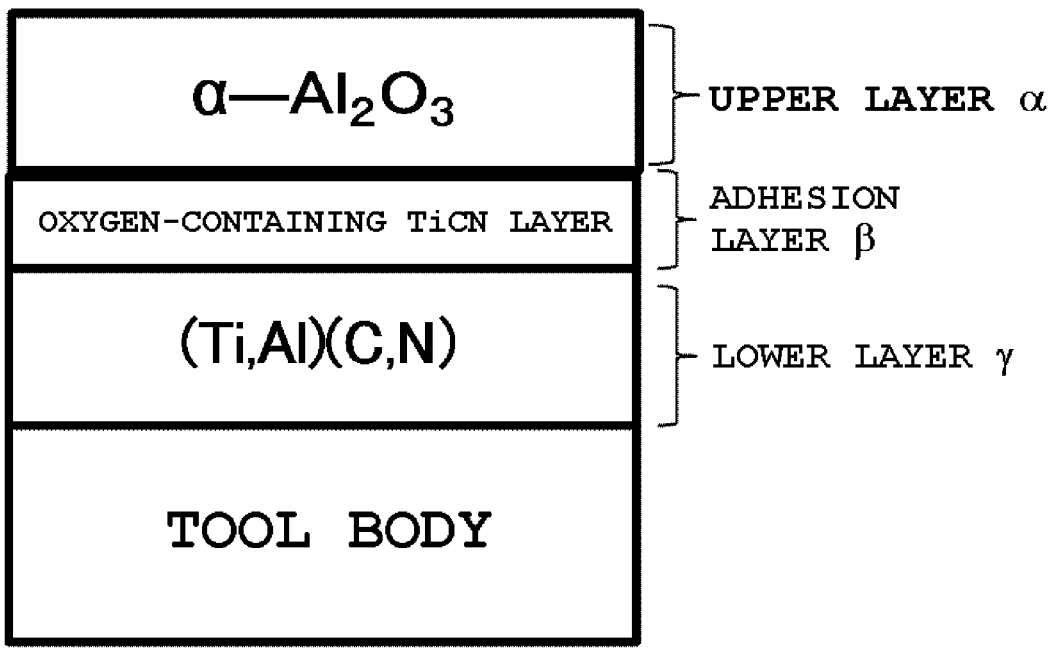
FIG. 1 illustrates an aspect of a schematic longitudinal sectional view of a layer structure of a hard coating layer of the present invention.
Figure 2:
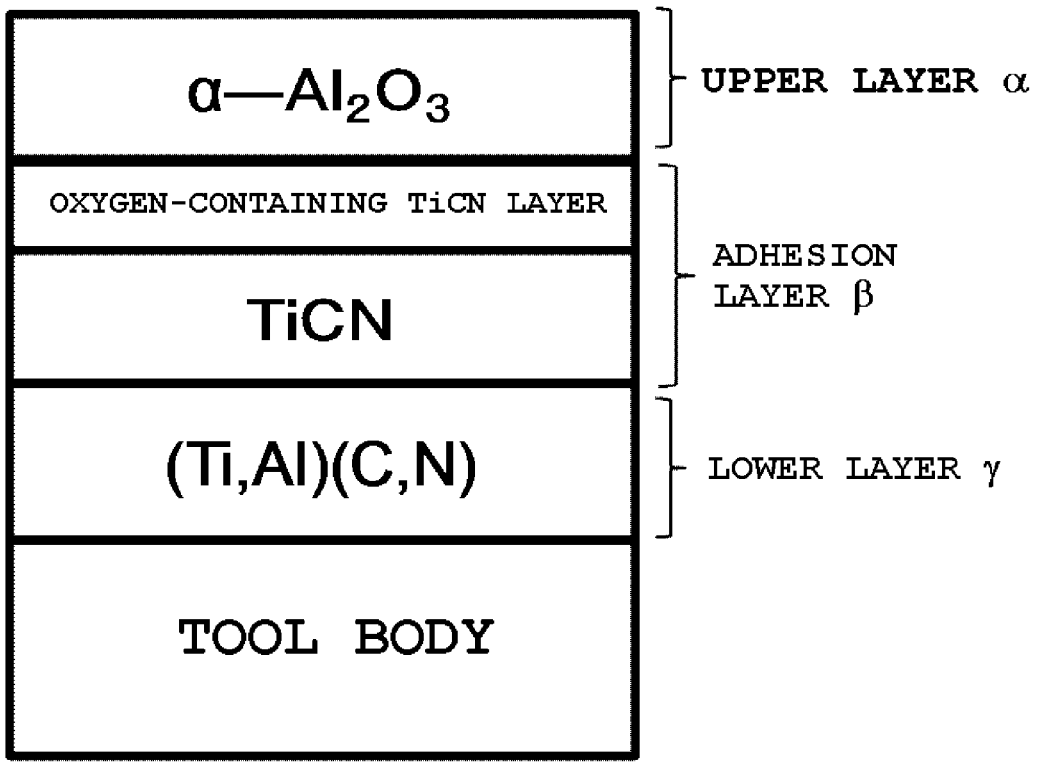
FIG. 2 illustrates an aspect of a schematic longitudinal sectional view in which an adhesion layer β includes a TiCN layer in the layer structure of the hard coating layer of the present invention.
Figure 3:
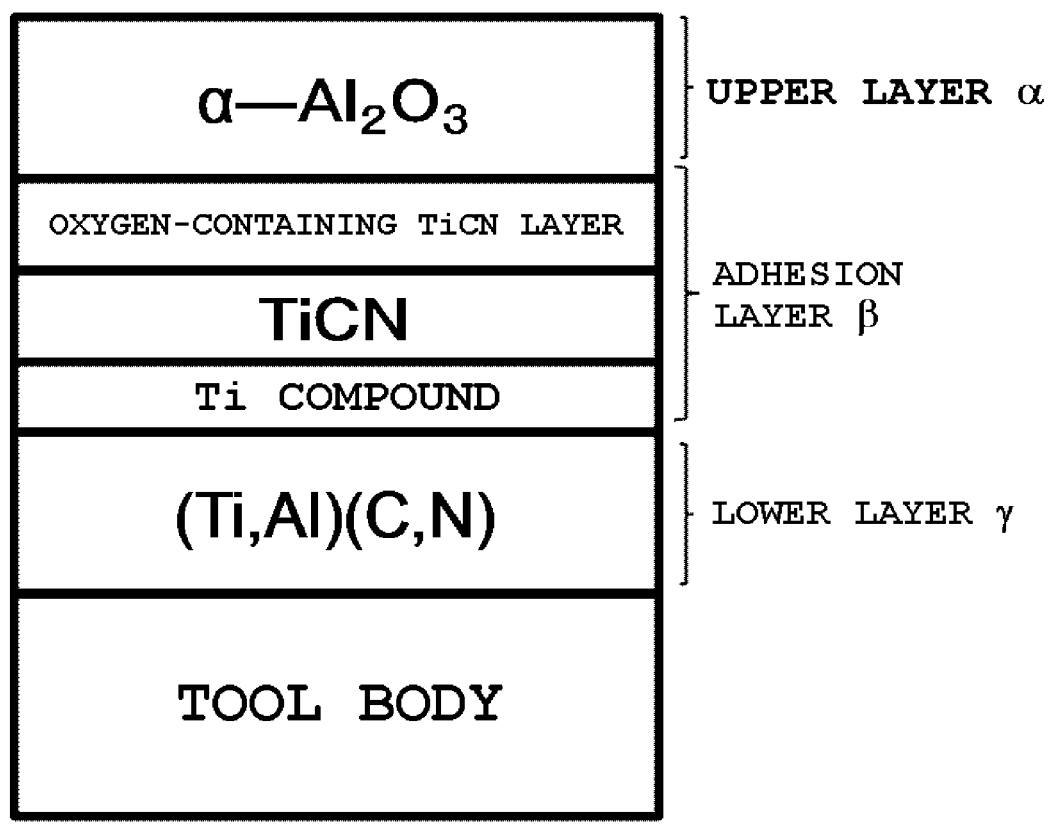
FIG. 3 illustrates an aspect of a schematic longitudinal sectional view in which the adhesion layer β includes a Ti compound layer in the layer structure of the hard coating layer of the present invention.
Figure 4:
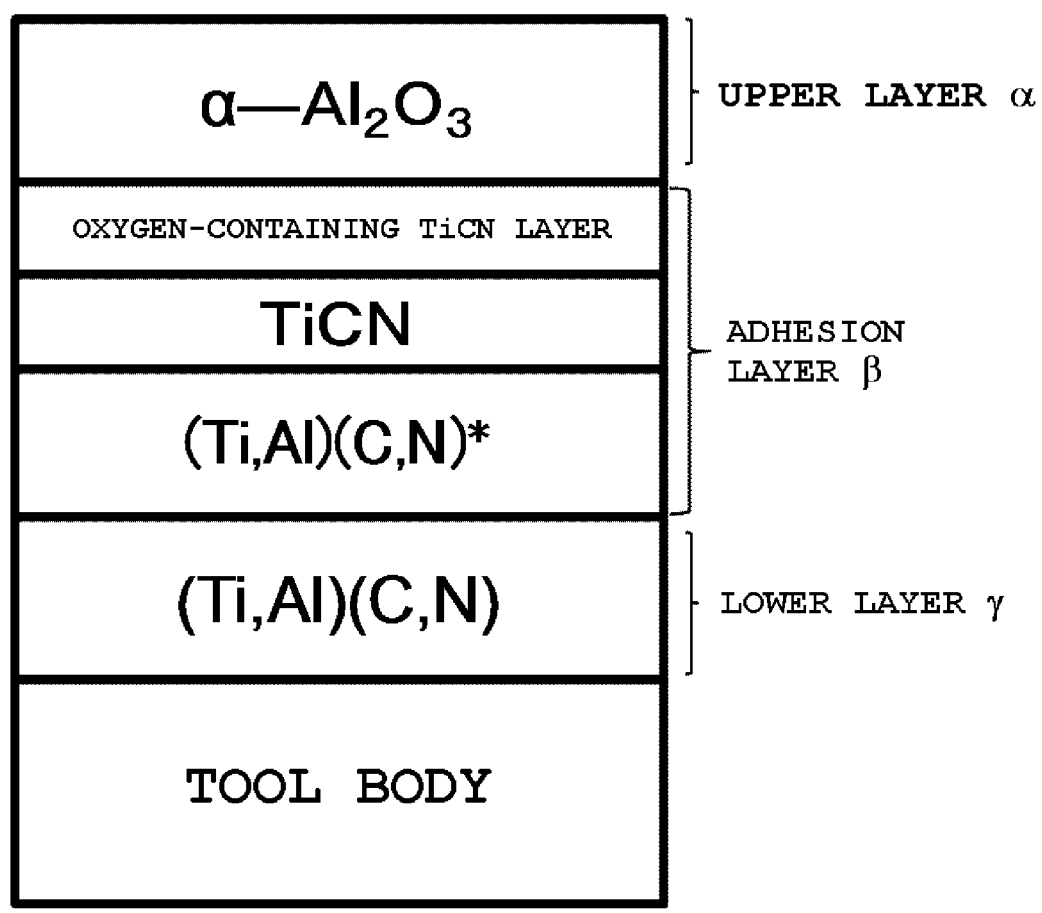
FIG. 4 illustrates an aspect of a schematic longitudinal sectional view in which the adhesion layer β includes a (Ti,Al)(C,N) layer in the layer structure of the hard coating layer of the present invention.
Figure 5:
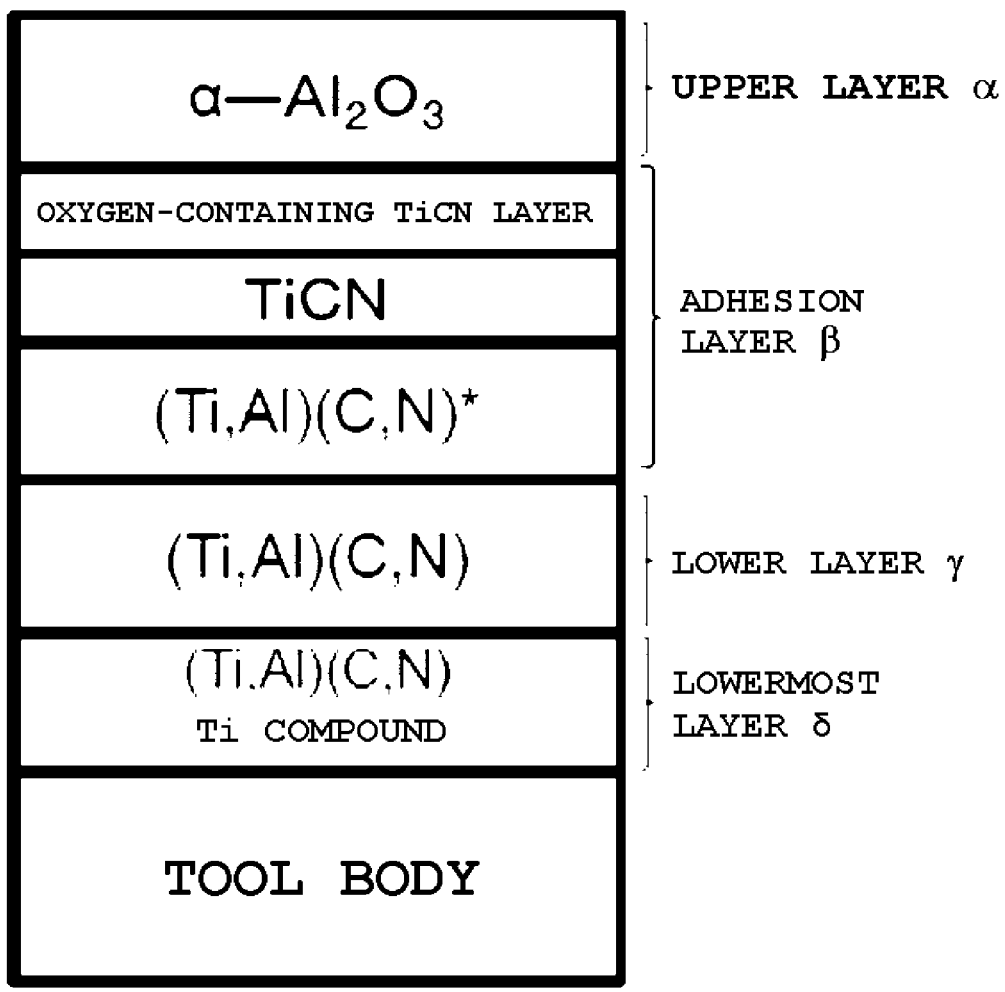
FIG. 5 illustrates an aspect of a schematic longitudinal sectional view in which a lowermost layer δ is included in the layer structure of the hard coating layer of the present invention.

Next, examples of a coated tool of the present invention will be described in detail.

Although a case of using tungsten carbide-based cemented carbide (hereinafter, referred to as "WC-based cemented carbide") or titanium carbonitride-based cermet (hereinafter, referred to as "TiCN-based cermet") as a tool body is described in the following examples, this can also be applied to a case of using a cubic boron nitride-based ultrahigh-pressure sintered body as the tool body.

Example 1

As raw material powders, a WC powder, a TiC powder, a TaC powder, a NbC powder, a $Cr_3C_2$ powder, and a Co powder, all of which had an average grain size of 1 to 3 μm, were prepared, and the raw material powders were mixed in mixing compositions shown in Table 1. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, tool bodies A to C made of WC-based cemented carbide with insert shapes according to ISO standard SEEN1203AFSN were produced.

In addition, as raw material powders, a TiCN (TiC/TiN=50/50 in terms of mass ratio) powder, an Mo$_2$C powder, a ZrC powder, a NbC powder, a WC powder, a Co powder, and a Ni powder, all of which had an average grain size of 0.5 to 2 μm, were prepared, and the raw material powders were mixed in mixing compositions shown in Table 2, were subjected to wet mixing by a ball mill for 24 hours, and were dried. Thereafter, the resultant was press-formed into a green compact at a pressure of 98 MPa, and the green compact was sintered in a nitrogen atmosphere at 1.3 kPa under the condition that the green compact was held at a temperature of 1500° C. for one hour. After the sintering, a tool body D made of TiCN-based cermet with insert shapes according to ISO standard SEEN1203AFSN was produced.

Next, on the surfaces of the tool bodies A to D, any one or both of a Ti compound layer and a (Ti,Al)(C,N) layer were formed as a lowermost layer δ using a typical chemical vapor deposition apparatus.

Specifically, as the lowermost layer δ as the Ti compound layer, the Ti compound layer shown in Table 6 was formed under conditions shown in Table 3, and as the lowermost layer δ as the (Ti,Al)(C,N) layer, the (Ti,Al)(C,N) layer shown in Table 6 was formed under gas conditions shown in Table 4 and forming conditions shown in Table 5.

For some of the tool bodies, both the Ti compound layer and the (Ti,Al)(C,N) layer were formed as the lowermost layer δ.

Under film forming conditions Aδ to Eδ for the lowermost layer δ formed of the (Ti,Al)(C,N) layer, by changing the gas conditions and forming conditions Aγ to Eγ shown in Tables 4 and 5 between the initial stage of film formation and the final stage of film formation, the (Ti,Al)(C,N) layer in which the content ratio of Al in the (Ti,Al)(C,N) layer was gradually increased continuously or in stages from the surface of the tool body toward a lower layer γ was formed.

Next, the lower layer γ formed of a (Ti,Al)(C,N) layer having a single phase of a NaCl type face-centered cubic structure was formed on the surface of the lowermost layer δ using the chemical vapor deposition apparatus under gas conditions Aγ to Eγ shown in Table 7 and under forming conditions Aγ to Eγ shown in Table 8.

That is, by performing a thermal CVD method for a predetermined time according to the forming conditions Aγ to Eγ shown in Tables 8 and 9, in which a gas group A of NH$_3$ and H$_2$ and a gas group B of TiCl$_4$, AlCl$_3$, N$_2$, C$_2$H$_4$, and H$_2$ were used, in each gas supply method, a reaction gas composition (vol % with respect to the total amount of the gas group A and the gas group B) included a gas group A of NH$_3$: 2.0% to 3.0% and H$_2$: 65% to 75% and a gas group B of AlCl$_3$: 0.6% to 0.9%, TiCl$_4$: 0.1% to 0.4%, N$_2$: 0.0% to 12.0%, C$_2$H$_4$: 0% to 0.5%, H$_2$: the remainder, a reaction atmosphere pressure was 4.5 kPa to 5.0 kPa, a reaction atmosphere temperature was 700° C. to 900° C., a supply period was 1 to 5 seconds, a gas supply time per one period was 0.15 to 0.25 seconds, and a phase difference between the supply of the gas group A and the supply of the gas group B was 0.10 to 0.20 seconds, the lower layer γ formed of the (Ti,Al)(C,N) layer shown in Table 14 was formed.

Next, an adhesion layer β was formed on the surface of the lower layer γ.

As the adhesion layer β, any one or both of a Ti compound layer and a (Ti,Al)(C,N) layer can be formed.

However, regardless of whether the adhesion layer β is formed of the Ti compound layer, the (Ti,Al)(C,N) layer, or both the Ti compound layer and the (Ti,Al)(C,N) layer, an oxygen-containing TiCN layer having a layer thickness of at least 0.5 μm or more is formed on the outermost surface of the adhesion layer β (the outermost layer of the adhesion layer β being in contact with the interface with an upper layer α).

Film forming conditions under which the adhesion layer β formed of the Ti compound layer is formed are shown in Table 9, film forming conditions Aβ to Eβ under which the adhesion layer β formed of the (Ti,Al)(C,N) layer is formed are shown in Tables 10 and 11, and film forming conditions A to D under which the adhesion layer β formed of a TiCN layer, which is one layer in the Ti compound layer, and the oxygen-containing TiCN layer is formed are shown in Table 12.

The adhesion layer β shown in Table 14 was formed under the film forming conditions shown in Tables 9 to 12.

Under the film forming conditions Aβ to Eβ for the adhesion layer β formed of the (Ti,Al)(C,N) layer, by changing the gas conditions and forming conditions shown in Tables 10 and 11 between the initial stage of film formation and the final stage of film formation, the (Ti,Al)(C,N) layer in which the content ratio of Al in the (Ti,Al)(C,N) layer was gradually decreased continuously or in stages from the lower layer γ toward the upper layer α was formed.

Subsequently, the upper layer α shown in Table 14 was formed on the surface of the adhesion layer β including at least the TiCN layer and the oxygen-containing TiCN layer in the outermost layer under film forming condition shown in Table 13.

In addition, for the upper layer α, two stages of film forming treatment including nucleation of α-Al$_2$O$_3$ in the initial stage of film formation, and film formation of α-Al$_2$O$_3$ were performed.

By the film forming processes described above, the hard coating layer including the lower layer γ, the adhesion layer β, and the upper layer α was formed on the surface of the tool body made of WC-based cemented carbide or TiCN-based cermet, whereby coated tools of present invention 1 to 15 shown in Table 14 were produced.

In addition, for the purpose of comparison, a lower layer γ formed of a (Ti,Al)(C,N) layer of a NaCl type face-centered cubic structure single phase was formed on the surfaces of the tool bodies A to D under the gas conditions Aγ to Eγ shown in Table 7 and under the forming conditions Aγ to Eγ shown in Table 8 using the chemical vapor deposition apparatus.

Next, an adhesion layer β formed of a Ti compound layer, an adhesion layer β formed of a (Ti,Al)(C,N) layer, or an adhesion layer β formed of both the layers was formed on the surface of the lower layer γ.

The adhesion layer β formed of the Ti compound layer was formed under conditions shown in Table 15, and the adhesion layer β formed of the (Ti,Al)(C,N) layer was formed under the same conditions as the conditions of the present invention shown in Tables 10 and 11.

The adhesion layer β formed of the (Ti,Al)(C,N) layer was formed so that as in the present invention, the content ratio of Al in the (Ti,Al)(C,N) layer gradually decreased continuously or in stages from the lower layer γ toward the upper layer α.

Next, an oxygen-containing TiCN layer was formed on the outermost surface of the adhesion layer β (the outermost layer of the adhesion layer (3 being in contact with the interface with the upper layer α) under conditions shown in Table 16.

In addition, the film forming temperature of the Ti compound layer shown in Table 15 is higher than the film forming temperature of the Ti compound layer of the present invention shown in Table 9, and the film forming temperature of the oxygen-containing TiCN layer shown in Table 16 is also higher than the film forming temperature of the TiCN layer and the oxygen-containing TiCN layer of the present invention shown in Table 12.

Next, an upper layer α was formed on the surface of the adhesion layer β in which the oxygen-containing TiCN layer was formed under film forming conditions shown in Table 17.

In addition, for the upper layer α, two stages of film forming treatment including nucleation of α-$Al_2O_3$ in the initial stage of film formation, and film formation of α-$Al_2O_3$ were performed.

The film forming temperature of the upper layer α shown in Table 17 is a temperature higher than the film forming temperature of the upper layer α of the present invention shown in Table 13.

By the film forming processes described above, the hard coating layer including the lower layer γ, the adhesion layer β, and the upper layer α was formed on the surface of the tool body made of WC-based cemented carbide or TiCN-based cermet, whereby comparative example coated tools 1 to 15 shown in Table 18 were produced.

The section of each of constituent layers of the coated tools of present invention 1 to 15 and the comparative example coated tools 1 to 15 in the direction perpendicular to the tool body was measured using a scanning electron microscope (at a magnification of 5,000 times). An average layer thickness was obtained by measuring and averaging the layer thicknesses of five points in an observation visual field. All of the results showed substantially the same average layer thicknesses as the target layer thicknesses shown in Tables 14 and 18.

In addition, regarding the average content ratio $X_{avg}$ of Al in the (Ti,Al) (C,N) layer forming the lower layer γ, a sample, of which the surface was polished, was irradiated with electron beams from the sample surface side, and the average content ratio $X_{avg}$ of Al was obtained by averaging 10 points of the analytic result of obtained characteristic X-rays, using an electron probe micro-analyzer (EPMA). The average content ratio $Y_{avg}$ of C was obtained by secondary ion mass spectroscopy (SIMS). Ion beams were emitted toward a range of 70 μm X 70 μm from the sample surface side, and the concentration of components emitted by a sputtering action was measured in a depth direction. The average content ratio $Y_{avg}$ of C represents the average value of the (Ti,Al)(C,N) layer in the depth direction.

The crystal structure of the (Ti,Al)(C,N) layer forming the lower layer γ was identified from diffraction peaks measured by X-ray diffraction, and whether the crystal structure was a single phase of a NaCl type cubic structure or included (Ti,Al)(C,N) crystal grains of a hexagonal crystal structure was examined. In addition, the X-ray diffraction measurement was performed by a 2θ-θ method using CuKα radiation with an X-ray diffractometer PANalytical Empyrean manufactured by Spectris, and the measurement was performed under measurement conditions of a measurement range (2θ) of 30 to 130 degrees, an X-ray output of 45 kV, 40 mA, a divergence slit of 0.5 degrees, a scan step of 0.013 degrees, and a measurement time per one step of 0.48 sec/step.

Regarding the (Ti,Al)(C,N) layer forming the lower layer γ, a small area of the layer was observed by using the transmission electron microscope under the condition of an acceleration voltage of 200 kV, and area analysis from the section side was performed using energy-dispersive X-ray spectroscopy (EDS), whereby the presence or absence of a periodic composition variation of Ti and Al in the composition formula: $(Ti_{1-X}Al_X)(C_YN_{1-Y})$ in the crystal grains having the NaCl type face-centered cubic structure was examined, and the presence or absence of crystal grains having a direction of the composition variation of the present invention in the crystal grains in which the composition variation was present was examined.

In addition, the "crystal grains having a direction of the composition variation of the present invention" refers to crystal grains in which the angle between the direction in which the period of the periodic composition variation of Ti and Al is minimized and the direction perpendicular to the surface of the tool body is 30 degrees or less.

The angle of the surface perpendicular to the surface of the tool body with respect to the direction of the periodic composition variation was measured as follows.

The angle can be obtained by observing an arbitrary area of 1 μm X 1 μm from an arbitrary section perpendicular to the body in the crystal grains having a NaCl type face-centered cubic structure using the transmission electron microscope and measuring the angle between the direction in which the periodic composition variation of Ti and Al is present and the period of the periodic composition variation of Ti and Al in the section is minimized and the surface of the tool body.

Tables 14 and 18 show the results.

Next, regarding the adhesion layer β, the average content ratio of oxygen in the oxygen-containing TiCN layer forming the outermost surface of the layer, that is, the average content ratio (=O/(Ti+C+N+O)×100) of oxygen in a depth area up to 0.5 μm in the layer thickness direction of the layer and the average content ratio (=O/(Ti+C+N+O)×100) of oxygen in a depth area exceeding 0.5 μm were calculated in terms of at % by measuring the intensities of the Auger peaks of Ti, C, N, and O by irradiating a polished surface of a longitudinal section of the adhesion layer β with an electron beam having a diameter of 10 nm using an Auger electron spectrometer and obtaining the ratio of the Auger peak of O to the sum of the peak intensities.

Tables 14 and 18 show such values.

Regarding the case where the adhesion layer β included the (Ti,Al)(C,N) layer, the average content ratio $X_{βavg}$ of Al to the total amount of Ti and Al in each of sections obtained by dividing the (Ti,Al)(C,N) layer by $[L_{avg}]+2$ in the layer thickness direction was obtained by performing area analysis using energy-dispersive X-ray spectroscopy (EDS). Here, $[L_{avg}]$ represents the Gaussian symbol. [x] is a mathematical symbol representing the largest integer that does not exceed x, and when [x]=n, x is defined as n≤x<n+1 (here, n is an integer).

Tables 14 and 18 show such values.

In addition, regarding the chlorine content in the upper layer α, a section of a sample was polished and irradiated with an electron beam at an acceleration voltage of 10 kV from the sample section side, and the average chlorine content $Cl_{avg}$ was calculated by averaging points of the analytic result of obtained characteristic X-rays, using the electron probe micro-analyzer (EPMA).

Tables 14 and 18 show such values.

TABLE 1

| Type | | Co | TiC | TaC | NbC | Cr₃C₂ | WC |
|---|---|---|---|---|---|---|---|
| Tool body | A | 8.0 | 1.5 | — | 3.0 | 0.4 | Remainder |
| | B | 8.5 | — | 1.8 | 0.2 | — | Remainder |
| | C | 7.0 | — | — | — | — | Remainder |

Mixing composition (mass %)

TABLE 2

| Type | Co | Ni | ZrC | NbC | Mo₂C | WC | TiCN |
|---|---|---|---|---|---|---|---|
| Tool body D | 8 | 5 | 1 | 6 | 6 | 10 | Remainder |

Mixing composition (mass %)

TABLE 3

| Ti compound layer of lowermost layer δ | | | Forming conditions (pressure of reaction atmosphere is expressed as kPa and temperature is expressed as ° C.) | | |
|---|---|---|---|---|---|
| Type | Formation symbol | Reaction gas composition (vol %) | | Pressure | Temperature |
| Ti compound layer | TiC | TiC | TiCl₄: 4.2%, CH₄: 8.5%, H₂: remainder | | 7 | 850 |
| | TiN | TiN | TiCl₄: 4.2%, N₂: 35%, H₂: remainder | | 7 | 800 |
| | TiCN | TiCN | TiCl₄: 3%, C₂H₄: 2.5%, NH₃: 0.8%, N₂: 20%, H₂: remainder | | 7 | 850 |
| | TiCO | TiCO | TiCl₄: 2%, CO₂: 3%, H₂: remainder | | 7 | 900 |
| | TiCNO | TiCNO | TiCl₄: 4%, C₂H₄: 2%, NH₃: 0.6%, N₂: 10%, CO₂: 3%, H₂: remainder | | 7 | 900 |

TABLE 4

| Formation of lowermost layer δ Formation symbol | | Gas conditions (reaction gas composition indicates proportion in total amount of gas group A and gas group B) | |
|---|---|---|---|
| | | Reaction gas group A composition (vol %) | Reaction gas group B composition (vol %) |
| Present invention film forming process | Aδ | Initial stage of film formation TiCl₄: 0.30%, AlCl₃: 0.10%, N₂: 8%, C₂H₄: 0%, H₂ as remainder | NH₃: 2.2%, H₂: 75% |
| | | Final stage of film formation TiCl₄: 0.10%, AlCl₃: 0.90%, N₂: 8%, C₂H₄: 0%, H₂ as remainder | NH₃: 2.2%, H₂: 75% |
| | Bδ | Initial stage of film formation TiCl₄: 0.50%, AlCl₃: 0.15%, N₂: 12%, C₂H₄: 0%, H₂ as remainder | NH₃: 2.0%, H₂: 75% |
| | | Final stage of film formation TiCl₄: 0.15%, AlCl₃: 0.85%, N₂: 12%, C₂H₄: 0%, H₂ as remainder | NH₃: 2.0%, H₂: 75% |
| | Cδ | Initial stage of film formation TiCl₄: 0.40%, AlCl₃: 0.10%, N₂: 0%, C₂H₄: 0.5%, H₂ as remainder | NH₃: 2.8%, H₂: 70% |
| | | Final stage of film formation TiCl₄: 0.30%, AlCl₃: 0.65%, N₂: 0%, C₂H₄: 0.5%, H₂ as remainder | NH₃: 2.8%, H₂: 70% |
| | Dδ | Initial stage of film formation TiCl₄: 0.45%, AlCl₃: 0.00%, N₂: 0%, C₂H₄: 0.2%, H₂ as remainder | NH₃: 2.0%, H₂: 68% |
| | | Final stage of film formation TiCl₄: 0.35%, AlCl₃: 0.60%, N₂: 0%, C₂H₄: 0.2%, H₂ as remainder | NH₃: 2.5%, H₂: 68% |
| | Eδ | Initial stage of film formation TiCl₄: 0.35%, AlCl₃: 0.10%, N₂: 0%, C₂H₄: 0%, H₂ as remainder | NH₃: 2.5%, H₂: 66% |
| | | Final stage of film formation TiCl₄: 0.40%, AlCl₃: 0.60%, N₂: 0%, C₂H₄: 0.2%, H₂ as remainder | NH₃: 3.0%, H₂: 65% |

TABLE 5

| Formation of lowermost layer δ | | Forming conditions (pressure of reaction atmosphere is expressed as kPa and temperature is expressed as °C.) | | | | | | |
|---|---|---|---|---|---|---|---|---|
| | | Gas group A | | Gas group B | | Phase difference in supply between gas group A and gas group B (sec) | Reaction atmosphere | |
| | Formation symbol | Supply period (sec) | Supply time per one period (sec) | Supply period (sec) | Supply time per one period (sec) | | Pressure | Temperature |
| Present invention film forming process | Aδ Initial stage of film formation | 2 | 0.20 | 2 | 0.20 | 0.10 | 4.5 | 800 |
| | Final stage of film formation | 2 | 0.20 | 2 | 0.20 | 0.10 | 4.5 | 800 |
| | Bδ Initial stage of film formation | 1 | 0.17 | 1 | 0.17 | 0.15 | 5.0 | 700 |
| | Final stage of film formation | 1 | 0.17 | 1 | 0.17 | 0.15 | 5.0 | 700 |
| | Cδ Initial stage of film formation | 5 | 0.25 | 5 | 0.25 | 0.20 | 4.7 | 720 |
| | Final stage of film formation | 5 | 0.25 | 5 | 0.25 | 0.20 | 4.7 | 720 |
| | Dδ Initial stage of film formation | 3 | 0.23 | 3 | 0.23 | 0.10 | 4.7 | 850 |
| | Final stage of film formation | 3 | 0.23 | 3 | 0.23 | 0.10 | 4.7 | 850 |
| | Eδ Initial stage of film formation | 4 | 0.15 | 4 | 0.15 | 0.20 | 5.0 | 900 |
| | Final stage of film formation | 4 | 0.15 | 4 | 0.15 | 0.20 | 5.0 | 900 |

TABLE 6

Lowermost layer δ
(numerical value at the bottom indicates the average target layer thickness of the layer (μm))

| Type | | Tool body symbol | First layer | Second layer | Third layer | (Ti, Al) (C, N) layer | | |
|---|---|---|---|---|---|---|---|---|
| | | | | | | Formation symbol | $X_{\delta avg}$ of section 1 | $X_{\delta avg}$ of section 2 |
| Coated tools of present invention | 1 | A | TiN (0.3) | — | — | Aδ | 0.28 | 0.45 |
| | 2 | B | TiC (0.2) | TiCN (0.5) | — | Bδ | 0.25 | 0.41 |
| | 3 | C | TiC (0.3) | — | — | Cδ | 0.21 | 0.36 |
| | 4 | A | TiN (0.3) | TiCO (0.5) | — | Dδ | 0.1 | 0.28 |
| | 5 | B | TiC (0.2) | TiCN (0.5) | TiCNO (0.5) | Eδ | 0.24 | 0.33 |
| | 6 | C | — | — | — | — | — | — |
| | 7 | D | — | — | — | Bδ | 0.22 | 0.43 |
| | 8 | A | TiC (0.3) | TiCN (0.4) | — | Cδ | 0.23 | 0.32 |
| | 9 | B | — | — | — | — | — | — |
| | 10 | C | — | — | — | — | — | — |
| | 11 | D | — | — | — | — | — | — |
| | 12 | A | — | — | — | — | — | — |
| | 13 | B | — | — | — | — | — | — |
| | 14 | C | — | — | — | — | — | — |
| | 15 | D | — | — | — | — | — | — |

Lowermost layer δ
(numerical value at the bottom indicates the average targetlayer thickness of the layer (μm))
(Ti, Al) (C, N) layer

| Type | $X_{\delta avg}$ of section 3 | $X_{\delta avg}$ of section 4 | $X_{\delta avg}$ of section 5 | $X_{\delta avg}$ of section 6 | $X_{\delta avg}$ of section 7 | $Y_{avg}$ | Average target layer thickness (μm) |
|---|---|---|---|---|---|---|---|
| Coated tools | 1 | 0.75 | — | — | — | — | 0.0001 or less | 1.0 |

TABLE 6-continued

|  |  |  |  |  |  |  |  |  |
|---|---|---|---|---|---|---|---|---|
| of present invention | 2 | 0.66 | — | — | — | — | 0.0001 or less | 1.5 |
|  | 3 | 0.47 | — | — | — | — | 0.0048 | 1.2 |
|  | 4 | 0.45 | — | — | — | — | 0.0033 | 1.0 |
|  | 5 | 0.41 | — | — | — | — | 0.0033 | 1.0 |
|  | 6 | — | — | — | — | — | — | — |
|  | 7 | 0.62 | — | — | — | — | 0.0001 or less | 1.1 |
|  | 8 | 0.42 | — | — | — | — | 0.0046 | 1.5 |
|  | 9 | — | — | — | — | — | — | — |
|  | 10 | — | — | — | — | — | — | — |
|  | 11 | — | — | — | — | — | — | — |
|  | 12 | — | — | — | — | — | — | — |
|  | 13 | — | — | — | — | — | — | — |
|  | 14 | — | — | — | — | — | — | — |
|  | 15 | — | — | — | — | — | — | — |

TABLE 7

| Formation of lower layer γ | | Gas conditions (reaction gas composition indicates proportion in total amount of gas group A and gas group B) | |
|---|---|---|---|
| | Formation symbol | Reaction gas group A composition (vol %) | Reaction gas group B composition (vol %) |
| Present invention film forming process | Aγ | $NH_3$: 2.2%, $H_2$: 75% | $TiCl_4$: 0.10%, $AlCl_3$: 0.90%, $N_2$: 8%, $C_2H_4$: 0%, $H_2$ as remainder |
| | Bγ | $NH_3$: 2.0%, $H_2$: 75% | $TiCl_4$: 0.15%, $AlCl_3$: 0.85%, $N_2$: 12%, $C_2H_4$: 0%, $H_2$ as remainder |
| | Cγ | $NH_3$: 2.8%, $H_2$: 70% | $TiCl_4$: 0.30%, $AlCl_3$: 0.65%, $N_2$: 0%, $C_2H_4$: 0.5%, $H_2$ as remainder |
| | Dγ | $NH_3$: 2.5%, $H_2$: 68% | $TiCl_4$: 0.35%, $AlCl_3$: 0.60%, $N_2$: 0%, $C_2H_4$: 0.2%, $H_2$ as remainder |
| | Eγ | $NH_3$: 3.0%, $H_2$: 65% | $TiCl_4$: 0.40%, $AlCl_3$: 0.60%, $N_2$: 0%, $C_2H_4$: 0.2%, $H_2$ as remainder |

TABLE 8

Forming conditions (pressure of reaction atmosphere is expressed as kPa and temperature is expressed as ° C.)

| Formation of lower layer γ | | Gas group A | | Gas group B | | Phase difference in supply between gas group A and gas group B (sec) | Reaction atmosphere | |
|---|---|---|---|---|---|---|---|---|
| Process type | Formation symbol | Supply period (sec) | Supply time per one period (sec) | Supply period (sec) | Supply time per one period (sec) | | Pressure | Temperature |
| Present invention film forming process | Aγ | 2 | 0.20 | 2 | 0.20 | 0.10 | 4.5 | 800 |
| | Bγ | 1 | 0.17 | 1 | 0.17 | 0.15 | 5.0 | 700 |
| | Cγ | 5 | 0.25 | 5 | 0.25 | 0.20 | 4.7 | 720 |
| | Dγ | 3 | 0.23 | 3 | 0.23 | 0.10 | 4.7 | 850 |
| | Eγ | 4 | 0.15 | 4 | 0.15 | 0.20 | 5.0 | 900 |

TABLE 9

| Ti compound layer of adhesion layer β | | | Forming conditions (pressure of reaction atmosphere is expressed as kPa and temperature is expressed as ° C.) | | |
|---|---|---|---|---|---|
| Type | | Formation symbol | Reaction gas composition (vol %) | Reaction atmosphere | |
| | | | | Pressure | Temperature |
| Ti compound layer | TiC | TiC | $TiCl_4$: 4.2%, $CH_4$: 8.5%, $H_2$: remainder | 7 | 850 |
| | TiN | TiN | $TiCl_4$: 4.2%, $N_2$: 35%, $H_2$: remainder | 7 | 800 |
| | TiCN | TiCN | $TiCl_4$: 3%, $C_2H_4$: 2.5%, $NH_3$: 0.8%, $N_2$: 20%, $H_2$: remainder | 7 | 850 |

TABLE 9-continued

| Ti compound layer of adhesion layer β | | Forming conditions (pressure of reaction atmosphere is expressed as kPa and temperature is expressed as ° C.) | | |
|---|---|---|---|---|
| | Formation | | Reaction atmosphere | |
| Type | symbol | Reaction gas composition (vol %) | Pressure | Temperature |
| TiCO | TiCO | TiCl$_4$: 2%, CO$_2$: 3%, H$_2$: remainder | 7 | 900 |
| TiCNO | TiCNO | TiCl$_4$: 4%, C$_2$H$_4$: 2%, NH$_3$: 0.6%, N$_2$: 10%, CO$_2$: 3%, H$_2$: remainder | 7 | 900 |

TABLE 10

| Formation of adhesion layer β | | Gas conditions (reaction gas composition indicates proportion in total amount of gas group A and gas group B) | |
|---|---|---|---|
| | Formation symbol | Reaction gas group A composition (vol %) | Reaction gas group B composition (vol %) |
| Present invention film forming process | Aβ | Initial stage of film formation NH$_3$: 2.2%, H$_2$: 75% | TiCl$_4$: 0.10%, AlCl$_3$: 0.90%, N$_2$: 1%, C$_2$H$_4$: 0%, H$_2$ as remainder |
| | | Final stage of film formation NH$_3$: 2.2%, H$_2$: 75% | TiCl$_4$: 0.30%, AlCl$_3$: 0.10%, N$_2$: 1%, C$_2$H$_4$: 0.5%, H$_2$ as remainder |
| | Bβ | Initial stage of film formation NH$_3$: 2.0%, H$_2$: 75% | TiCl$_4$: 0.15%, AlCl$_3$: 0.85%, N$_2$: 12%, C$_2$H$_4$: 0%, H$_2$ as remainder |
| | | Final stage of film formation NH$_3$: 2.0%, H$_2$: 75% | TiCl$_4$: 0.50%, AlCl$_3$: 0.15%, N$_2$: 6%, C$_2$H$_4$: 0%, H$_2$ as remainder |
| | Cβ | Initial stage of film formation NH$_3$: 2.8%, H$_2$: 70% | TiCl$_4$: 0.30%, AlCl$_3$: 0.65%, N$_2$: 0%, C$_2$H$_4$: 0.5%, H$_2$ as remainder |
| | | Final stage of film formation NH$_3$: 2.8%, H$_2$: 70% | TiCl$_4$: 0.40%, AlCl$_3$: 0.10%, N$_2$: 0%, C$_2$H$_4$: 0.5%, H$_2$ as remainder |
| | Dβ | Initial stage of film formation NH$_3$: 2.5%, H$_2$: 68% | TiCl$_4$: 0.35%, AlCl$_3$: 0.60%, N$_2$: 3%, C$_2$H$_4$: 0.2%, H$_2$ as remainder |
| | | Final stage of film formation NH$_3$: 2.0%, H$_2$: 68% | TiCl$_4$: 0.45%, AlCl$_3$: 0.15%, N$_2$: 3%, C$_2$H$_4$: 0.2%, H$_2$ as remainder |
| | Eβ | Initial stage of film formation NH$_3$: 3.0%, H$_2$: 65% | TiCl$_4$: 0.40%, AlCl$_3$: 0.60%, N$_2$: 8%, C$_2$H$_4$: 0.2%, H$_2$ as remainder |
| | | Final stage of film formation NH$_3$: 2.5%, H$_2$: 66% | TiCl$_4$: 0.35%, AlCl$_3$: 0.10%, N$_2$: 8%, C$_2$H$_4$: 0.4%, H$_2$ as remainder |

TABLE 11

| Formation of adhesion layer β | | Forming conditions (pressure of reaction atmosphere is expressed as kPa and temperature is expressed as ° C.) | | | | | | |
|---|---|---|---|---|---|---|---|---|
| | | Gas group A | | Gas group B | | Phase difference in supply between gas group A and gas group B | Reaction atmosphere | |
| | Formation symbol | Supply period (sec) | Supply time per one period (sec) | Supply period (sec) | Supply time per one period (sec) | (sec) | Pressure | Temperature |
| Present invention film forming process | Aβ Initial stage of film formation | 2 | 0.20 | 2 | 0.20 | 0.10 | 4.5 | 800 |
| | Final stage of film formation | 2 | 0.20 | 2 | 0.20 | 0.10 | 4.5 | 800 |
| | Bβ Initial stage of film formation | 1 | 0.17 | 1 | 0.17 | 0.15 | 5.0 | 700 |
| | Final stage of film formation | 1 | 0.17 | 1 | 0.17 | 0.15 | 5.0 | 700 |
| | Cβ Initial stage of film formation | 5 | 0.25 | 5 | 0.25 | 0.20 | 4.7 | 720 |
| | Final stage of film formation | 5 | 0.25 | 5 | 0.25 | 0.20 | 4.7 | 720 |

TABLE 11-continued

Forming conditions
(pressure of reaction atmosphere is expressed as kPa and temperature is expressed as °C.)

| Formation of adhesion layer β Formation symbol | | Gas group A | | Gas group B | | Phase difference in supply between gas group A and gas group B (sec) | Reaction atmosphere | |
|---|---|---|---|---|---|---|---|---|
| | | Supply period (sec) | Supply time per one period (sec) | Supply period (sec) | Supply time per one period (sec) | | Pressure | Temperature |
| Dβ | Initial stage of film formation | 3 | 0.23 | 3 | 0.23 | 0.10 | 4.7 | 850 |
| | Final stage of film formation | 3 | 0.23 | 3 | 0.23 | 0.10 | 4.7 | 850 |
| Eβ | Initial stage of film formation | 4 | 0.15 | 4 | 0.15 | 0.20 | 5.0 | 900 |
| | Final stage of film formation | 4 | 0.15 | 4 | 0.15 | 0.20 | 5.0 | 900 |

TABLE 12

"TiCN layer" and "oxygen-containing TiCN layer" of adhesion layer β — Forming conditions (pressure of reaction atmosphere is expressed as kPa and temperature is expressed as °C.)

| Formation symbol | Reaction gas composition (vol %) | Reaction atmosphere Pressure | Temperature | Amount of $CO_2$ added during film formation of oxygen-containing TiCN layer (vol %) |
|---|---|---|---|---|
| A | TiCN: $TiCl_4$: 2%, $C_2H_4$: 2.0%, $NH_3$: 0.5%, $N_2$: 10%, $H_2$: remainder | 6 | 800 | 5 |
| B | TiCN: $TiCl_4$: 3%, $C_2H_4$: 2.2%, $NH_3$: 0.6%, $N_2$: 12%, $H_2$: remainder | 10 | 900 | 3 |
| C | TiCN: $TiCl_4$: 4%, $C_2H_4$: 3.0%, $NH_3$: 1.0%, $N_2$: 17%, $H_2$: remainder | 7 | 870 | 4 |
| D | TiCN: $TiCl_4$: 6%, $C_2H_4$: 2.8%, $NH_3$: 0.8%, $N_2$: 20%, $H_2$: remainder | 9 | 830 | 1 |

TABLE 13

Upper layer α ($\alpha$-$Al_2O_3$) — Forming conditions (pressure of reaction atmosphere is expressed as kPa and temperature is expressed as °C.)

| Formation symbol | Reaction gas group A composition (vol %) | Reaction atmosphere Pressure | Temperature |
|---|---|---|---|
| A | Initial nucleation conditions: $AlCl_3$: 3.0%, $CO_2$: 5%, HCl: 1.0%, $H_2$: remainder | 5 | 850 |
| | Growth conditions: $AlCl_3$: 2.0%, $CO_2$: 8%, HCl: 3.0%, $H_2S$: 0.7%, $H_2$: remainder | 5 | 850 |
| B | Initial nucleation conditions: $AlCl_3$: 2.0%, $CO_2$: 1%, HCl: 0.3%, $H_2$: remainder | 15 | 900 |
| | Growth conditions: $AlCl_3$: 1.5%, $CO_2$: 6%, HCl: 4.0%, $H_2S$: 0.5%, $H_2$: remainder | 10 | 900 |
| C | Initial nucleation conditions: $AlCl_3$: 1.0%, $CO_2$: 2%, HCl: 0.5%, $H_2$: remainder | 7.5 | 800 |
| | Growth conditions: $AlCl_3$: 4.0%, $CO_2$: 4%, HCl: 6.0%, $H_2S$: 0.9%, $H_2$: remainder | 15 | 800 |
| D | Initial nucleation conditions: $AlCl_3$: 2.5%, $CO_2$: 4%, HCl: 0.8%, $H_2$: remainder | 10 | 850 |
| | Growth conditions: $AlCl_3$: 5.0%, $CO_2$: 2%, HCl: 8.0%, $H_2S$: 1.0%, $H_2$: remainder | 12.5 | 850 |

TABLE 14

| | | | | Lower layer γ | | | | Hard coating layer | | | | | | |
|---|---|---|---|---|---|---|---|---|---|---|---|---|---|---|
| Type | | Tool body symbol | Formation symbol | Average layer thickness (μm) | $X_{avg}$ | $Y_{avg}$ | Presence or absence of hexagonal structure | Presence or absence of composition variation of present invention | Adhesion layer β (Ti, Al) (C, N) layer | | | | | |
| | | | | | | | | | Formation symbol | $X_{avg}$ of section 1 | $X_{avg}$ of section 2 | $X_{avg}$ of section 3 | $X_{avg}$ of section 4 | $X_{avg}$ of section 5 | $X_{avg}$ of section 6 |
| Coated tools of present invention | 1 | A | Aγ | 3.4 | 0.93 | 0.0001 or less | AB | AB | Aβ | 0.68 | 0.3 | — | — | — | — |
| | 2 | B | Bγ | 4.0 | 0.83 | 0.0001 or less | AB | PR | Bβ | 0.7 | 0.5 | 0.25 | — | — | — |
| | 3 | C | Cγ | 1.8 | 0.68 | 0.0050 | AB | AB | Cβ | 0.73 | 0.24 | — | — | — | — |
| | 4 | A | Dγ | 2.6 | 0.62 | 0.0035 | AB | AB | Dβ | 0.57 | 0.54 | 0.36 | 0.24 | — | — |
| | 5 | B | Eγ | 1.5 | 0.60 | 0.0030 | AB | AB | Eβ | 0.4 | 0.23 | — | — | — | — |
| | 6 | C | Aγ | 1.0 | 0.95 | 0.0001 or less | AB | AB | Aβ | 0.78 | 0.61 | 0.37 | — | — | — |
| | 7 | A | Bγ | 5.9 | 0.83 | 0.0001 or less | AB | PR | Bβ | 0.61 | 0.42 | 0.25 | — | — | — |
| | 8 | B | Cγ | 3.5 | 0.68 | 0.0047 | AB | AB | — | — | — | — | — | — | — |
| | 9 | C | Dγ | 1.2 | 0.63 | 0.0033 | AB | AB | — | — | — | — | — | — | — |
| | 10 | A | Eγ | 3.9 | 0.60 | 0.0037 | AB | AB | — | — | — | — | — | — | — |
| | 11 | B | Aγ | 3.5 | 0.91 | 0.0001 or less | AB | AB | — | — | — | — | — | — | — |
| | 12 | C | Bγ | 2.4 | 0.85 | 0.0001 or less | AB | PR | — | — | — | — | — | — | — |
| | 13 | A | Cγ | 3.3 | 0.69 | 0.0048 | AB | AB | — | — | — | — | — | — | — |
| | 14 | B | Dγ | 4.6 | 0.63 | 0.0033 | AB | AB | — | — | — | — | — | — | — |
| | 15 | C | Eγ | 1.0 | 0.60 | 0.0036 | AB | AB | — | — | — | — | — | — | — |

TABLE 14-continued

| | | | Hard coating layer | | | | | | | | | |
|---|---|---|---|---|---|---|---|---|---|---|---|---|
| | (Ti, Al) (C, N) layer | | Adhesion layer β | | | | TiCN layer and oxygen-containing TiCN layer | | | | Upper layer α | | |
| Type | X$_{avg}$ of section 7 | Average layer thickness (μm) | Formation symbol of Ti compound layer (numerical value at the bottom indicates the average target layer thickness of the layer (μm)) | | | Formation symbol | Average oxygen content at depth up to 0.5 μm (at %) | Average oxygen content at depth exceeding 0.5 μm (at %) | Total average layer thickness (μm) | Formation symbol | Chlorine content (at %) | Average layer thickness (μm) |
| | | | First layer | Second layer | Third layer | | | | | | | |
| Coated tools of present invention  1 | — | 0.3 | TiN (0.2) | — | — | A | 2.9 | 0.0* | 1.5 | A | 0.06 | 1.8 |
| 2 | — | 1.5 | TiC (0.5) | — | — | B | 1.6 | 0.0* | 3.5 | B | 0.09 | 1.4 |
| 3 | — | 0.5 | TiC (0.3) | TiCO (0.4) | — | A | 2.9 | 0.0* | 2.2 | C | 0.41 | 2.6 |
| 4 | — | 2.0 | TiN (0.3) | TiC (0.5) | — | B | 1.8 | 0.0* | 5.0 | D | 0.50 | 2.3 |
| 5 | — | 0.5 | TiC (0.2) | TiCN (0.5) | — | A | 3.0 | 0.0* | 4.0 | A | 0.06 | 2.0 |
| 6 | — | 1.0 | — | — | — | C | 2.1 | 0.0* | 3.4 | B | 0.07 | 1.4 |
| 7 | — | 1.2 | — | — | — | D | 0.5 | 0.0* | 3.0 | C | 0.34 | 1.5 |
| 8 | — | — (0.3) | TiC (0.2) | TiCNO (0.5) | TiCO | C | 2.0 | 0.0* | 2.3 | D | 0.47 | 1.3 |
| 9 | — | — | — | — | D | — | 0.0* | 2.4 | 0.5 | A | 0.05 | 5.0 |
| 10 | — | — | — | — | C | — | 0.0* | 3.0 | 2.1 | B | 0.04 | 3.5 |
| 11 | — | — | — | — | B | — | 0.0* | 5.0 | 1.5 | D | 0.51 | 2.3 |
| 12 | — | — | — | — | A | — | 0.0* | 0.5 | 3.0 | D | 0.52 | 1.2 |
| 13 | — | — | — | — | B | — | 0.0* | 0.7 | 1.8 | A | 0.04 | 1.0 |
| 14 | — | — | — | — | — | — | 0.0* | 2.1 | 2.8 | A | 0.03 | 2.2 |
| 15 | — | — | — | — | B | — | 0.0* | 1.0 | 1.4 | D | 0.52 | 1.2 |

(Note 1)
Any of X$_{avg}$ and Y$_{avg}$ in boxes indicates atomic ratio.

(Note 2)
"Presence or absence of hexagonal structure" in boxes indicates "PR (Present)" in a case where crystal grains having a hexagonal structure are contained from diffraction peaks measured by X-ray diffraction, and indicates "AB (Absent)" in a case of a single phase of a cubic structure.

(Note 3)
"Presence or absence of composition variation of present invention" in boxes indicates ""PR (Present)" in a case where crystal grains having a NaCl type face-centered cubic structure in which the angle between the direction in which the period of a periodic composition variation of Ti and Al and the surface perpendicular to the surface of the tool body is 30 degrees or less are present, and indicates "AB (Absent)" in a case where such crystal grains are not present.

(Note 4)
* in boxes indicates that an average oxygen content of 0 at % means that only unavoidable oxygen is determined.

TABLE 15

| Ti compound layer of adhesion layer β | | | Forming conditions (pressure of reaction atmosphere is expressed as kPa and temperature is expressed as ° C.) | | |
|---|---|---|---|---|---|
| | | Formation | | Reaction atmosphere | |
| Type | | symbol | Reaction gas composition (vol %) | Pressure | Temperature |
| Ti compound layer | TiC | TiC | TiCl$_4$: 4.2%, CH$_4$: 8.5%, H$_2$: remainder | 7 | 1020 |
| | TiN | TiN | TiCl$_4$: 4.2%, N$_2$: 35%, H$_2$: remainder | 7 | 1000 |
| | TiCN | TiCN | TiCl$_4$: 4%, CH$_4$: 1%, N$_2$: 25%, H$_2$: remainder | 7 | 1000 |
| | TiCO | TiCO | TiCl$_4$: 2%, CO$_2$: 2%, H$_2$: remainder | 7 | 1020 |
| | TiCNO | TiCNO | TiCl$_4$: 4%, CH$_4$: 2%, N$_2$: 15%, CO$_2$: 6%, H$_2$: remainder | 7 | 1020 |

TABLE 16

| "Oxygen-containing HT-TiCN layer" of adhesion layer β | Forming conditions (pressure of reaction atmosphere is expressed as kPa and temperature is expressed as ° C.) | | |
|---|---|---|---|
| Formation | | Reaction atmosphere | |
| symbol | Reaction gas composition (vol %) | Pressure | Temperature |
| a | HT-TiCN: TiCl$_4$: 2%, CH$_4$: 1%, CO$_2$: 2%, N$_2$: 10%, H$_2$: remainder | 6 | 1000 |
| b | HT-TiCN: TiCl$_4$: 2.5%, CH$_4$: 2%, CO$_2$: 6%, N$_2$: 20%, H$_2$: remainder | 10 | 1000 |
| c | HT-TiCN: TiCl$_4$: 7%, CH$_4$: 3%, CO$_2$: 4%, N$_2$: 20%, H$_2$: remainder | 7 | 1000 |
| d | HT-TiCN: TiCl$_4$: 4%, CH$_4$: 2.6%, CO$_2$: 2%, N$_2$: 25%, H$_2$: remainder | 9 | 1000 |

TABLE 17

| Upper layer α (α-Al$_2$O$_3$) | Forming conditions (pressure of reaction atmosphere is expressed as kPa and temperature is expressed as ° C.) | | |
|---|---|---|---|
| Formation | | Reaction atmosphere | |
| symbol | Reaction gas composition (vol %) | Pressure | Temperature |
| a | Initial nucleation conditions: AlCl$_3$: 3.0%, CO$_2$: 5%, HCl: 1.0%, H$_2$: remainder | 5 | 1000 |
| | Growth conditions: AlCl$_3$: 2.0%, CO$_2$: 8%, HCl: 3.0%, H$_2$S: 0.7%, H$_2$: remainder | 5 | 1000 |
| b | Initial nucleation conditions: AlCl$_3$: 2.0%, CO$_2$: 1%, HCl: 0.3%, H$_2$: remainder | 15 | 960 |
| | Growth conditions: AlCl$_3$: 1.5%, CO$_2$: 6%, HCl: 4.0%, H$_2$S: 0.5%, H$_2$: remainder | 10 | 960 |
| c | Initial nucleation conditions: AlCl$_3$: 1.0%, CO$_2$: 2%, HCl: 0.5%, H$_2$: remainder | 7.5 | 1040 |
| | Growth conditions: AlCl$_3$: 4.0%, CO$_2$: 4%, HCl: 6.0%, H$_2$S: 0.9%, H$_2$: remainder | 15 | 1040 |
| d | Initial nucleation conditions: AlCl$_3$: 2.5%, CO$_2$: 4%, HCl: 0.8%, H$_2$: remainder | 10 | 1020 |
| | Growth conditions: AlCl$_3$: 5.0%, CO$_2$: 2%, HCl: 8.0%, H$_2$S: 1.0%, H$_2$: remainder | 12.5 | 1020 |

TABLE 18

| Type | | Tool | | Hard coating layer | | | | | | | | | |
|---|---|---|---|---|---|---|---|---|---|---|---|---|---|
| | | | | Lower layer γ | | | | | | adhesion layer β (Ti, Al) (C, N) layer | | | |
| | | body symbol | Formation symbol | Average layer thickness (μm) | $X_{avg}$ | $Y_{avg}$ | Presence or absence of hexagonal structure | Presence or absence of composition variation of present invention | Formation symbol | $X_{avg}$ of section 1 | $X_{avg}$ of section 2 | $X_{avg}$ of section 3 | $X_{avg}$ of section 4 | $X_{avg}$ of section 5 |
| Comparative example coated tool | 1 | A | Aγ | 3.5 | 0.93 | 0.0001 or less | PR | AB | Aβ | 0.66 | 0.29 | — | — | — |
| | 2 | B | Bγ | 4.0 | 0.83 | 0.0001 or less | PR | AB | Bβ | 0.6 | 0.4 | 0.21 | — | — |
| | 3 | C | Cγ | 2.5 | 0.90 | 0.0050 | PR | AB | Cβ | 0.69 | 0.2 | — | — | — |
| | 4 | A | Dγ | 2.6 | 0.66 | 0.0035 | PR | AB | Dβ | 0.5 | 0.36 | 0.21 | — | — |
| | 5 | B | Eγ | 1.5 | 0.60 | 0.0034 | PR | AB | Eβ | 0.4 | 0.23 | — | — | — |
| | 6 | C | Aγ | 1.0 | 0.94 | 0.0001 or less | PR | AB | Aβ | 0.69 | 0.41 | 0.19 | — | — |
| | 7 | A | Bγ | 1.2 | 0.83 | 0.0001 or less | PR | AB | Bβ | 0.6 | 0.39 | — | — | — |
| | 8 | B | Cγ | 3.5 | 0.88 | 0.0047 | PR | AB | Cβ | 0.55 | 0.35 | 0.28 | — | — |
| | 9 | C | Dγ | 2.5 | 0.64 | 0.0033 | PR | AB | Dβ | 0.41 | 0.3 | 0.21 | — | — |
| | 10 | A | Eγ | 4.5 | 0.60 | 0.0037 | PR | AB | Eβ | 0.5 | 0.42 | 0.31 | 0.2 | — |
| | 11 | B | Aγ | 5.0 | 0.94 | 0.0001 or less | PR | AB | — | — | — | — | — | — |
| | 12 | C | Bγ | 3.0 | 0.82 | 0.0001 or less | PR | AB | — | — | — | — | — | — |
| | 13 | A | Cγ | 3.5 | 0.89 | 0.0048 | PR | AB | — | — | — | — | — | — |
| | 14 | B | Dγ | 4.0 | 0.67 | 0.0033 | PR | AB | — | — | — | — | — | — |
| | 15 | C | Eγ | 2.0 | 0.61 | 0.0036 | PR | AB | — | — | — | — | — | — |

TABLE 18-continued

| | | (Ti, Al) (C, N) layer | | | Hard coating layer adhesion layer β | | | | Oxygen-containing TiCN layer | | | Upper layer α | | |
|---|---|---|---|---|---|---|---|---|---|---|---|---|---|---|
| | | $X_{avg}$ of section 6 | $X_{avg}$ of section 7 | Average layer thickness (μm) | Formation symbol of Ti compound layer (numerical value at the bottom indicates the average target layer thickness of the layer (μm)) | | | Formation symbol | Average oxygen content at depth up to 0.5 μm (at %) | Average oxygen content at depth exceeding 0.5 μm (at %) | Total average layer thickness (μm) | Formation symbol | Chlorine content (at %) | Average layer thickness (μm) |
| Type | | | | | First layer | Second layer | Third layer | | | | | | | |
| Comparative example coated tool | 1 | — | — | 0.5 | TiN (0.2) | — | — | a | 2.2 | 2.2 | 1.7 | a | 0.03 | 1.9 |
| | 2 | — | — | 1.0 | TiC (0.5) | — | — | b | 3.6 | 3.6 | 3 | b | 0.04 | 1.4 |
| | 3 | — | — | 0.5 | TiC (0.3) | TiCO (0.4) | — | a | 2.3 | 2.3 | 2 | c | 0.04 | 1.5 |
| | 4 | — | — | 1.4 | TiN (0.3) | TiC (0.5) | — | b | 3.4 | 3.4 | 3 | d | 0.04 | 1.4 |
| | 5 | — | — | 0.5 | TiC (0.2) | TiCN (0.5) | TiCO (0.5) | a | 2.1 | 2.2 | 2.90 | a | 0.03 | 1.6 |
| | 6 | — | — | 1.0 | TiN (0.3) | — | — | c | 2.0 | 2.0 | 2.3 | b | 0.02 | 1.7 |
| | 7 | — | — | 0.5 | TiC (0.3) | — | — | d | 1.5 | 1.5 | 3.1 | c | 0.04 | 1.4 |
| | 8 | — | — | 1.5 | TiC (0.3) | TiCNO (0.2) | TiCO (0.5) | c | 2.1 | 2.2 | 3.5 | d | 0.04 | 1.3 |
| | 9 | — | — | 1.0 | TiN (0.2) | — | — | d | 1.5 | 1.5 | 3.5 | a | 0.03 | 2.1 |
| | 10 | — | — | 2.5 | TiC (0.2) | — | — | c | 2.1 | 2.0 | 5.20 | b | 0.04 | 1.3 |
| | 11 | — | — | — | TiC (0.3) | — | — | b | 3.5 | 3.4 | 1.2 | c | 0.03 | 2.1 |
| | 12 | — | — | — | — | — | — | a | 2.1 | 2.0 | 1 | d | 0.04 | 2.1 |
| | 13 | — | — | — | TiN (0.2) | — | — | b | 3.4 | 3.4 | 1.4 | a | 0.02 | 1.6 |

TABLE 18-continued

| | | | | TiN (0.3) | TiCNO (0.3) | TiC (0.3) | a | | | | b | | |
|---|---|---|---|---|---|---|---|---|---|---|---|---|---|
| 14 | — | — | — | — | — | — | b | 2.2 | 2.2 | 2 | b | 0.02 | 1.8 |
| 15 | — | — | — | — | — | — | — | 3.7 | 3.6 | 1.5 | c | 0.04 | 2.0 |

(Note 1)
Any of Xavg and Yavg in boxes indicates atomic ratio.
(Note 2)
"Presence or absence of hexagonal structure" in boxes indicates "PR (Present)" in a case where crystal grains having a hexagonal structure are contained from diffraction peaks measured by X-ray diffraction, and indicates "AB (Absent)" in a case of a single phase of a cubic structure.
(Note 3)
"Presence or absence of composition variation of present invention" in boxes indicates "PR (Present)" in a case where crystal grains having a NaCl type face-centered cubic structure in which the angle between the direction in which the period of a periodic composition variation of Ti and Al and the surface perpendicular to the surface of the tool body is 30 degrees or less are present, and indicates "AB (Absent)" in a case where such crystal grains are not present.

Next, in a state in which each of the various coated tools was clamped to a cutter tip end portion made of tool steel with a cutter diameter of 125 mm by a fixing tool, the coated tools of present invention 1 to 15 and the comparative example coated tools 1 to 15 were subjected to wet high-speed face milling, which is a type of high-speed intermittent cutting of cast iron, and a center-cut cutting test, which will be described below, and the flank wear width of a cutting edge was measured.

Table 19 shows the results.

Cutting test: wet high-speed face milling, center-cut cutting

Cutter diameter: 125 mm

Work material: a block material of JIS FCD700 with a width of 100 mm and a length of 400 mm Rotational speed: 891 $min^{-1}$ Cutting speed: 350 m/min Depth of cut: 1.5 mm Feed per tooth: 0.3 mm/tooth Cutting time: 5 minutes (a typical cutting speed is 200 m/min)

TABLE 19

| Type | | Flank wear width (mm) | Type | | Cutting test results (min) |
|---|---|---|---|---|---|
| Coated tools of present invention | 1 | 0.10 | Comparative coated tool | 1 | 3.1 |
| | 2 | 0.08 | | 2 | 3.2 |
| | 3 | 0.12 | | 3 | 3.4 |
| | 4 | 0.13 | | 4 | 2.8 |
| | 5 | 0.12 | | 5 | 3.6 |
| | 6 | 0.11 | | 6 | 4.2 |
| | 7 | 0.09 | | 7 | 3.4 |
| | 8 | 0.14 | | 8 | 3.3 |
| | 9 | 0.16 | | 9 | 3.1 |
| | 10 | 0.16 | | 10 | 2.4 |
| | 11 | 0.15 | | 11 | 3.3 |
| | 12 | 0.15 | | 12 | 2.9 |
| | 13 | 0.16 | | 13 | 2.5 |
| | 14 | 0.17 | | 14 | 2.2 |
| | 15 | 0.18 | | 15 | 3.0 |

Numerical values in boxes of comparative coated tools indicate cutting times (min) until the end of a service life caused by the occurrence of chipping.

From the results shown in Table 19, in the coated tools of present invention, since the lower layer γ has a single phase of a NaCl type cubic structure and thus has high hardness, and furthermore, the oxygen-containing TiCN layer having excellent adhesion to the upper layer α is formed between the upper layer α and the adhesion layer β, which are formed under low temperature conditions, the occurrence of chipping and the occurrence of peeling are suppressed, whereby excellent wear resistance is exhibited during long-term use in high-speed intermittent cutting during which intermittent and impact loads are exerted on a cutting edge.

Contrary to this, the comparative example coated tools reach the end of the service life within a short period of time due to the occurrence of abnormal damage such as chipping and peeling.

Example 2

On the surfaces of the tool bodies A to C made of WC-based cemented carbide shown in Table 1 and the surface of the tool body D made of TiCN-based cermet shown in Table 2, any one or both of a Ti compound layer and a (Ti,Al)(C,N) layer were formed as a lowermost layer δ using a typical chemical vapor deposition apparatus.

Specifically, as the lowermost layer δ as the Ti compound layer, the Ti compound layer shown in Table 22 was formed under the conditions shown in Table 3, and as the lowermost layer δ as the (Ti,Al)(C,N) layer, the (Ti,Al)(C,N) layer shown in Table 22 was formed under gas conditions shown in Table 20 and forming conditions shown in Table 21.

For some of the tool bodies, both the Ti compound layer and the (Ti,Al)(C,N) layer were formed as the lowermost layer δ.

Under film forming conditions Aδ to Eδ for the lowermost layer δ formed of the (Ti,Al)(C,N) layer, by changing the gas conditions and forming conditions shown in Tables 20 and 21 between the initial stage of film formation and the final stage of film formation, the (Ti,Al)(C,N) layer in which the content ratio of Al in the (Ti,Al)(C,N) layer was gradually increased continuously or in stages from the surface of the tool body toward a lower layer γ was formed.

Here, when the average content ratio of $X_{\delta avg}$ of Al to the total amount of Ti and Al in each of sections obtained by dividing the (Ti,Al)(C,N) layer as the lowermost layer δ by $[L_{avg}]+2$ was obtained, $X_{\delta avg} < X_{avg}$ was satisfied in each of the sections, and $X_{\delta avg}$ of the section closer to the surface side being equal to or greater than $X_{\beta avg}$ of the section closer to the body side was satisfied.

Next, the lower layer γ formed of a (Ti,Al)(C,N) layer having a single phase of a NaCl type face-centered cubic structure, shown in Table 23, was formed on the surface of the lowermost layer δ formed on the surfaces of the tool bodies A to D using the chemical vapor deposition apparatus under the gas conditions Aγ to Eγ shown in Table 7 and under the forming conditions Aγ to Eγ shown in Table 8.

Next, an adhesion layer β was formed on the surface of the lower layer γ.

As the adhesion layer β, any one or both of a Ti compound layer and a (Ti,Al)(C,N) layer were formed.

However, regardless of whether the adhesion layer β was formed of the Ti compound layer, the (Ti,Al)(C,N) layer, or both the Ti compound layer and the (Ti,Al)(C,N) layer, an oxygen-containing TiCN layer having a layer thickness of at least 0.5 μm or more was formed on the outermost surface of the adhesion layer β (the outermost layer of the adhesion layer β being in contact with the interface with an upper layer α).

Film forming conditions under which the adhesion layer β formed of the Ti compound layer was formed are shown in Table 9, film forming conditions Aβ to Eβ under which the adhesion layer β formed of the (Ti,Al)(C,N) layer was formed are shown in Tables 10 and 11, and film forming conditions A to D under which the adhesion layer β formed of a TiCN layer, which is one layer in the Ti compound layer, and the oxygen-containing TiCN layer was formed are shown in Table 12.

The adhesion layer β shown in Table 23 was formed under the film forming conditions shown in Tables 9 to 12.

Under the film forming conditions Aβ to Eβ for the adhesion layer β formed of the (Ti,Al)(C,N) layer, by changing the gas conditions and forming conditions shown in Tables 10 and 11 between the initial stage of film formation and the final stage of film formation as in the case of Example 1, the (Ti,Al)(C,N) layer in which the content ratio of Al in the (Ti,Al)(C,N) layer was gradually decreased continuously or in stages from the lower layer γ toward the upper layer α was formed.

However, the average layer thickness $L_{avg}$ (μm) of the (Ti,Al)(C,N) layer of the adhesion layer β satisfied $0.30 \leq L_{avg} \leq 5.0$, and when an average content ratio $X_{\beta avg}$ of Al to the total amount of Ti and Al was obtained in each of sections obtained by dividing the layer of a complex nitride or complex carbonitride of Ti and Al by $[L_{avg}]+2$, $X_{\beta avg} < X_{avg}$ was satisfied in each of the sections, and $X_{\beta avg}$ of the section closer to the surface side being equal to or smaller than $X_{\beta avg}$ of the section closer to the body side was satisfied.

Subsequently, the upper layer α shown in Table 23 was formed on the surface of the adhesion layer β including at least the TiCN layer and the oxygen-containing TiCN layer in the outermost layer under the film forming condition shown in Table 13.

In addition, for the upper layer α, two stages of film forming treatment including nucleation of α-$Al_2O_3$ in the initial stage of film formation, and film formation of α-$Al_2O_3$ were performed.

By the processes described above, the hard coating layer including the lowermost layer δ, the lower layer γ, the adhesion layer β, and the upper layer α was formed on the surface of the tool bodies A to C and D, whereby coated tools of present invention 16 to 25 were produced.

For the coated tools of present invention 16 to 25, each of the following measurements was performed in the same manner as in the case of Example 1.

First, the average layer thickness of each layer was obtained, and all of the results showed substantially the same average layer thicknesses as the target layer thicknesses shown in Tables 22 and 23.

In addition, the average content ratio $X_{avg}$ of Al and the average content ratio $Y_{avg}$ of C in the (Ti,Al)(C,N) layer forming the lower layer γ were obtained, and Table 23 shows the results.

In addition, whether the (Ti,Al)(C,N) layer forming the lower layer γ had a single phase of a NaCl type cubic structure or contained (Ti,Al)(C,N) crystal grains having a hexagonal crystal structure was examined, and Table 23 shows the results.

Furthermore, regarding the (Ti,Al)(C,N) layer forming the lower layer γ, the presence or absence of a periodic composition variation of Ti and Al in the crystal grains having the NaCl type face-centered cubic structure was examined, and the presence or absence of crystal grains (crystal grains in which the angle between the direction in which the period of the periodic composition variation of Ti and Al was minimized and the direction perpendicular to the surface of the tool body was 30 degrees or less) having a direction of the composition variation of the present invention in the crystal grains in which the composition variation was present was examined.

Table 23 shows the results.

In addition, regarding the adhesion layer β, the average content ratio (=O/(Ti+C+N+O)×100) of oxygen in the oxygen-containing TiCN layer forming the outermost surface of the layer in a depth area up to 0.5 μm in the layer thickness direction of the layer and the average content ratio (=O/(Ti+C+N+O)×100) of oxygen in a depth area exceeding 0.5 μm were obtained by Auger electron spectrometry in the same manner as in the case of Example 1.

Table 23 shows the results.

Regarding the case where the adhesion layer β included the (Ti,Al)(C,N) layer, the average content ratio $X_{\beta avg}$ of Al to the total amount of Ti and Al in each of sections obtained by dividing the (Ti,Al)(C,N) layer by $[L_{avg}]+2$ in the layer thickness direction was obtained by performing area analysis using energy-dispersive X-ray spectroscopy (EDS). Here, $[L_{avg}]$ represents the Gaussian symbol. [x] is a mathematical symbol representing the largest integer that does not exceed x, and when [x]=n, x is defined as n≤x<n+1 (here, n is an integer).

Tables 22 and 23 show the results.

In addition, regarding the chlorine content in the upper layer α, a section of a sample was polished and irradiated with an electron beam at an acceleration voltage of 10 kV from the sample section side, and the average chlorine content $Cl_{avg}$ was calculated by averaging points of the analytic result of obtained characteristic X-rays, using the electron probe micro-analyzer (EPMA).

Table 23 shows the results.

TABLE 20

| Formation of | Gas conditions (reaction gas composition indicates proportion in total amount of gas group A and gas group B) | |
|---|---|---|
| lowermost layer δ Formation symbol | Reaction gas group A composition (vol %) | Reaction gas group B composition (vol %) |
| Present invention film forming process | Aδ Initial stage of film formation NH$_3$: 2.2%, H$_2$: 75% | TiCl$_4$: 0.36%, AlCl$_3$: 0.10%, N$_2$: 0%, C$_2$H$_4$: 0%, H$_2$ as remainder |
| | Final stage of film formation NH$_3$: 2.2%, H$_2$: 75% | TiCl$_4$: 0.10%, AlCl$_3$: 0.60%, N$_2$: 8%, C$_2$H$_4$: 0%, H$_2$ as remainder |
| | Bδ Initial stage of film formation NH$_3$: 2.0%, H$_2$: 75% | TiCl$_4$: 0.52%, AlCl$_3$: 0.12%, N$_2$: 6%, C$_2$H$_4$: 0%, H$_2$ as remainder |
| | Cδ Final stage of film formation NH$_3$: 2.0%, H$_2$: 75% | TiCl$_4$: 0.15%, AlCl$_3$: 0.85%, N$_2$: 12%, C$_2$H$_4$: 0%, H$_2$ as remainder |
| | Initial stage of film formation NH$_3$: 2.8%, H$_2$: 70% | TiCl$_4$: 0.44%, AlCl$_3$: 0.12%, N$_2$: 0%, C$_2$H$_4$: 0%, H$_2$ as remainder |
| | Final stage of film formation NH$_3$: 2.8%, H$_2$: 70% | TiCl$_4$: 0.30%, AlCl$_3$: 0.50%, N$_2$: 0%, C$_2$H$_4$: 0.5%, H$_2$ as remainder |
| | Dδ Initial stage of film formation NH$_3$: 2.5%, H$_2$: 68% | TiCl$_4$: 0.42%, AlCl$_3$: 0.10%, N$_2$: 0%, C$_2$H$_4$: 0.2%, H$_2$ as remainder |
| | Final stage of film formation NH$_3$: 2.5%, H$_2$: 68% | TiCl$_4$: 0.35%, AlCl$_3$: 0.60%, N$_2$: 0%, C$_2$H$_4$: 0.2%, H$_2$ as remainder |
| | Eδ Initial stage of film formation NH$_3$: 2.5%, H$_2$: 66% | TiCl$_4$: 0.38%, AlCl$_3$: 0.10%, N$_2$: 0%, C$_2$H$_4$: 0.2%, H$_2$ as remainder |
| | Final stage of film formation NH$_3$: 2.5%, H$_2$: 65% | TiCl$_4$: 0.40%, AlCl$_3$: 0.60%, N$_2$: 0%, C$_2$H$_4$: 0.2%, H$_2$ as remainder |

TABLE 21

| Formation of lowermost layer δ | | Gas group A | | Gas group B | | Phase difference in supply between gas group A and gas group B | Reaction atmosphere | |
|---|---|---|---|---|---|---|---|---|
| | | Supply period | Supply time per one period | Supply period | Supply time per one period | | | |
| | Formation symbol | (sec) | (sec) | (sec) | (sec) | (sec) | Pressure | Temperature |
| Present invention film forming process | Aδ Initial stage of film formation | 1 | 0.15 | 1 | 0.15 | 0.10 | 4.5 | 800 |
| | Final stage of film formation | 1 | 0.15 | 1 | 0.15 | 0.10 | 4.5 | 800 |
| | Bδ Initial stage of film formation | 2 | 0.2 | 2 | 0.2 | 0.15 | 4.7 | 700 |
| | Final stage of film formation | 2 | 0.2 | 2 | 0.2 | 0.15 | 4.7 | 700 |
| | Cδ Initial stage of film formation | 3 | 0.25 | 3 | 0.25 | 0.20 | 4.7 | 720 |
| | Final stage of film formation | 3 | 0.25 | 3 | 0.25 | 0.20 | 4.7 | 720 |
| | Dδ Initial stage of film formation | 5 | 0.25 | 5 | 0.25 | 0.10 | 4.7 | 850 |
| | Final stage of film formation | 5 | 0.25 | 5 | 0.25 | 0.10 | 4.7 | 850 |
| | Eδ Initial stage of film formation | 4 | 0.15 | 4 | 0.15 | 0.20 | 5.0 | 900 |
| | Final stage of film formation | 4 | 0.15 | 4 | 0.15 | 0.20 | 5.0 | 900 |

TABLE 22

Lowermost layer δ
(numerical value at the bottom indicates the average target layer thickness of the layer (μm))

| Type | Tool body symbol | First layer | Second layer | Third layer | (Ti, Al) (C, N) layer | | |
|---|---|---|---|---|---|---|---|
| | | | | | Formation symbol | $X_{\delta avg}$ of section 1 | $X_{\delta avg}$ of section 2 |
| Coated tools of present invention | 16 | A | TiN (0.3) | — | — | Aδ | 0.29 | 0.52 |
| | 17 | B | TiC (0.3) | TiCN (2.3) | — | Bδ | 0.24 | 0.52 |
| | 18 | C | TiCO (0.5) | — | — | Cδ | 0.2 | 0.31 |
| | 19 | A | TiC (0.2) | TiCN (2.8) | TiCNO (2.0) | Dδ | 0.22 | 0.28 |
| | 20 | B | — | — | — | Eδ | 0.21 | 0.28 |
| | 21 | C | — | — | — | — | — | — |
| | 22 | A | — | — | — | — | — | — |
| | 23 | B | — | — | — | — | — | — |
| | 24 | C | — | — | — | — | — | — |
| | 25 | D | — | — | — | — | — | — |

Lowermost layer δ
(numerical value at the bottom indicates the average targetlayer thickness of the layer (μm))
(Ti, Al) (C, N) layer

| Type | $X_{\delta avg}$ of section 3 | $X_{\delta avg}$ of section 4 | $X_{\delta avg}$ of section 5 | $X_{\delta avg}$ of section 6 | $X_{\delta avg}$ of section 7 | $Y_{avg}$ | Average target layer thickness (μm) |
|---|---|---|---|---|---|---|---|
| Coated tools of present invention | | | | | | | |
| 16 | 0.71 | — | — | — | — | 0.0001 or less | 1.0 |
| 17 | 0.56 | 0.68 | — | — | — | 0.0001 or less | 2.0 |
| 18 | 0.42 | — | — | — | — | 0.0048 | 1.2 |
| 19 | 0.33 | 0.34 | 0.35 | 0.42 | 0.44 | 0.0033 | 5.0 |
| 20 | 0.34 | 0.38 | 0.40 | — | — | 0.0033 | 3.5 |
| 21 | — | — | — | — | — | — | — |
| 22 | — | — | — | — | — | — | — |

TABLE 22-continued

| | | | | | | | |
|---|---|---|---|---|---|---|---|
| 23 | — | — | — | — | — | — | — |
| 24 | — | — | — | — | — | — | — |
| 25 | — | — | — | — | — | — | — |

TABLE 23

| Type | | Tool body symbol | Formation symbol | Lower layer γ | | | | Presence or absence of hexagonal structure | Presence or absence of composition variation of present invention | Formation symbol | Adhesion layer β (Ti, Al) (C, N) layer | | | | | | |
|---|---|---|---|---|---|---|---|---|---|---|---|---|---|---|---|---|---|
| | | | | Average layer thickness (μm) | $X_{avg}$ | $Y_{avg}$ | | | | | $X_{avg}$ of section 1 | $X_{avg}$ of section 2 | $X_{avg}$ of section 3 | $X_{avg}$ of section 4 | $X_{avg}$ of section 5 | $X_{avg}$ of section 6 |
| Coated tools of present invention | 16 | A | Aγ | 20.0 | 0.94 | 0.0001 or less | | AB | AB | Aβ | 0.8 | 0.75 | 0.6 | 0.57 | 0.27 | — |
| | 17 | B | Bγ | 10.0 | 0.84 | 0.0001 or less | | AB | PR | Bβ | 0.7 | 0.57 | 0.54 | 0.41 | 0.37 | 0.23 |
| | 18 | C | Cγ | 7.5 | 0.67 | 0.0050 | | AB | AB | Cβ | 0.75 | 0.72 | 0.5 | 0.44 | 0.28 | 0.22 |
| | 19 | A | Dγ | 10.1 | 0.63 | 0.0035 | | AB | AB | Dβ | 0.6 | 0.51 | 0.41 | 0.3 | 0.25 | |
| | 20 | B | Bγ | 9.0 | 0.60 | 0.0034 | | AB | AB | Eβ | 0.5 | 0.35 | 0.22 | — | — | — |
| | 21 | C | Aγ | 7.6 | 0.92 | 0.0001 or less | | AB | AB | Aβ | 0.74 | 0.5 | 0.28 | — | — | — |
| | 22 | A | Bγ | 5.0 | 0.83 | 0.0001 or less | | AB | PR | Bβ | 0.63 | 0.44 | 0.32 | 0.24 | — | — |
| | 23 | B | Cγ | 4.1 | 0.68 | 0.0047 | | AB | AB | — | — | — | — | — | — | — |
| | 24 | C | Dγ | 4.0 | 0.63 | 0.0033 | | AB | AB | — | — | — | — | — | — | — |
| | 26 | A | Eγ | 6.0 | 0.60 | 0.0030 | | AB | AB | — | — | — | — | — | — | — |

| Type | | Adhesion layer β (Ti, Al) (C, N) layer | | Hard coating layer | | | | | Upper layer α | | |
|---|---|---|---|---|---|---|---|---|---|---|---|
| | | | | Formation symbol of Ti compound layer (numerical value at the bottom indicates the average target layer thickness of the layer (μm)) | | | TiCN layer and oxygen-containing TiCN layer | | | | |
| | | $X_{avg}$ of section 7 | Average layer thickness (μm) | First layer | Second layer | Third layer | Formation symbol | Average oxygen content at depth up to 0.5 μm (at %) | Average oxygen content at depth exceeding 0.5 μm (at %) | Total average layer thickness (μm) | Formation symbol | Chlorine content (at %) | Average layer thickness (μm) |
| Coated tools of present invention | 16 | — | 3.0 | TiN (0.2) | — | — | A | 3.0 | 0.0* | 4.5 | A | 0.06 | 3.0 |
| | 17 | 0.22 | 5.0 | TiC (0.5) | — | — | B | 1.6 | 0.0* | 10.0 | B | 0.07 | 5.0 |

TABLE 23-continued

| | | | | | | | | | | |
|---|---|---|---|---|---|---|---|---|---|---|
| 18 | — | 4.0 | TiC (0.3) | TiCO (0.4) | A | 2.9 | 0.0* | 5.3 | C | 0.42 | 10.0 |
| 19 | — | 3.0 | TiN (0.3) | TiC (0.5) | B | 1.7 | 0.0* | 5.0 | D | 0.51 | 2.3 |
| 20 | — | 1.8 | TiC (0.2) TiN (0.3) | TiCN (0.5) | TiCO (0.5) | A | 2.8 | 0.0* | 4.0 | A | 0.04 | 2.0 |
| 21 | — | 1.0 | — | — | C | 2.4 | 0.0* | 3.4 | B | 0.07 | 4.0 |
| 22 | — | 2.4 | — | — | D | 0.5 | 0.0* | 5.0 | C | 0.34 | 5.0 |
| 23 | — | — | — | — | C | 2.0 | 0.0* | 3.9 | D | 0.52 | 3.5 |
| 24 | — | — | — | — | D | 0.7 | 0.0* | 6.9 | A | 0.04 | 9.0 |
| 26 | — | — | — | — | C | 2.4 | 0.0* | 3.2 | B | 0.05 | 3.5 |

(Note 1)
Any of Xavg and Yavg in boxes indicates atomic ratio.
(Note 2)
"Presence or absence of hexagonal structure" in boxes indicates "PR (Present)" in a case where crystal grains having a hexagonal structure are contained from diffraction peaks measured by X-ray diffraction, and indicates "AB (Absent)" in a case of a single phase of a cubic structure.
(Note 3)
"Presence or absence of composition variation of present invention" in boxes indicates "PR (Present)" in a case where crystal grains having a NaCl type face-centered cubic structure in which the angle between the direction in which the period of a periodic composition variation of Ti and Al and the surface perpendicular to the surface of the tool body is 30 degrees or less are present, and indicates "AB (Absent)" in a case where such crystal grains are not present.
(Note 4)
*in boxes indicates that an average oxygen content of 0 at % means that only unavoidable oxygen is determined.

Next, in a state in which each of the coated tools of present invention 16 to 25 was screwed to a tip end portion of an insert holder made of tool steel by a fixing tool, a wet high-speed intermittent cutting test for stainless steel, which will be described below, was conducted thereon, and the flank wear width of a cutting edge was measured.

Work material: a round bar of JIS SUS304 with four longitudinal grooves formed at equal intervals in the longitudinal direction
Cutting speed: 300 m/min
Depth of cut: 1.0 mm
Feed: 0.2 mm/rev
Cutting time: 5 minutes
(a typical cutting speed is 150 m/min)
The results of the cutting test are shown in Table 24.

TABLE 24

| Type | | Flank wear width (mm) |
|---|---|---|
| Coated tools of present invention | 16 | 0.13 |
| | 17 | 0.11 |
| | 18 | 0.13 |
| | 19 | 0.16 |
| | 20 | 0.15 |
| | 21 | 0.15 |
| | 22 | 0.14 |
| | 23 | 0.19 |
| | 24 | 0.18 |
| | 25 | 0.17 |

From the results shown in Table 24, in the coated tools of present invention, since the lower layer γ has a single phase of a NaCl type cubic structure and thus has high hardness, and furthermore, the oxygen-containing TiCN layer having excellent adhesion to the upper layer α is formed between the upper layer α and the adhesion layer β, which are formed under low temperature conditions, the occurrence of chipping and the occurrence of peeling are suppressed.

Therefore, the coated tools of present invention exhibit excellent wear resistance during long-term use in high-speed intermittent cutting during which intermittent and impact loads are exerted on a cutting edge.

INDUSTRIAL APPLICABILITY

As described above, the coated tool of the present invention exhibits excellent wear resistance during long-term use in high-speed intermittent cutting during which intermittent and impact loads are exerted on a cutting edge and thus sufficiently satisfy an improvement in performance of a cutting device, power saving and energy saving during cutting, and a further reduction in costs.

The invention claimed is:

1. A surface-coated cutting tool comprising:
a hard coating layer including at least three layers of an upper layer α, an adhesion layer β, and a lower layer γ; and
a tool body, wherein
the hard coating layer is formed on a surface of the tool body which is made of any of a cemented carbide containing tungsten carbide, a cermet containing titanium carbonitride, or a cubic boron nitride ultrahigh-pressure sintered body,
(a) the upper layer α is formed of an $Al_2O_3$ layer having an α-type crystal structure with an average layer thickness of 1.0 to 10 μm,
(b) the adhesion layer β has a total average layer thickness of 0.5 to 10.0 μm, and contains an outermost layer that is in contact with an interface with the upper layer α and includes at least a TiCN layer having a layer thickness of at least 0.5 μm or more,
(c) oxygen is contained to a maximum depth of 0.5 μm toward the inside in a layer thickness direction of the TiCN layer from the interface with the upper layer α, and an average oxygen content in the depth area is 0.5 to 3 at % of a total content of Ti, C, N, and O contained in the depth area,
(d) the lower layer γ is formed of a layer of a complex nitride or complex carbonitride of Ti and Al having an average layer thickness of 1.0 to 20 μm,
(e) the layer of a complex nitride or complex carbonitride of Ti and Al is formed of a single phase of a NaCl type face-centered cubic structure,
(f) in a case where an average composition of the layer of a complex nitride or complex carbonitride of Ti and Al is expressed by $(Ti_{1-X}Al_X)(C_YN_{1-Y})$, an average content ratio $X_{avg}$ of Al to a total amount of Ti and Al and an average content ratio $Y_{avg}$ of C to a total amount of C and N (here, each of $X_{avg}$ and $Y_{avg}$ is in atomic ratio) respectively satisfy $0.60 \leq X_{avg} \leq 0.95$ and $0 \leq Y_{avg} \leq 0.005$, and
(g) the adhesion layer β further includes a layer of a complex nitride or complex carbonitride of Ti and Al whose average layer thickness $L_{avg}$ (μm) satisfies $0.30 \leq L_{avg} 5.0$, and when $X_{\beta avg}$ is an average content ratio of Al to a total amount of Ti and Al in each section obtained by dividing the layer of a complex nitride or complex carbonitride of Ti and Al by $[L_{avg}]+2$, $X_{\beta avg} < X_{avg}$ is satisfied in each of the sections, and $X_{\beta avg}$ of a section closer to a surface side is equal to or smaller than $X_{\beta avg}$ of a section closer to a body side.

2. The surface-coated cutting tool according to claim 1, wherein the upper layer a contains 0.05 to 0.5 at % of chlorine.

3. The surface-coated cutting tool according to claim 1, wherein the average content ratio $X_{avg}$ of Al to the total amount of Ti and Al of the layer of a complex nitride or complex carbonitride of Ti and Al in the lower layer γ is $0.70 \leq X_{avg} \leq 0.95$.

4. The surface-coated cutting tool according to claim 1, wherein the adhesion layer β further includes one or two or more layers selected from a Ti carbide layer, a Ti nitride layer, a Ti carbonitride layer, a Ti oxycarbide layer, and a Ti oxycarbonitride layer.

5. The surface-coated cutting tool according to claim 1, wherein, in a case where the layer of a complex nitride or complex carbonitride of Ti and Al in the lower layer γ is analyzed in an arbitrary section perpendicular to the surface of the tool body, crystal grains having a NaCl type face-centered cubic structure, which has a periodic composition variation of Ti and Al, are present, and at least the crystal grains, in which an angle between a direction in which a period of the periodic composition variation of Ti and Al is minimized and a surface perpendicular to the surface of the tool body is 30 degrees or less, are present.

6. The surface-coated cutting tool according to claim 1, wherein a lowermost layer δ is present between the tool body and the lower layer γ, and
the lowermost layer δ is formed of one or two or more layers selected from a layer of a complex nitride or complex carbonitride of Ti and Al with a different composition from the lower layer γ, a Ti carbide layer, a Ti nitride layer, a Ti carbonitride layer, a Ti oxycarbide layer, and a Ti oxycarbonitride layer and has a total average layer thickness of 0.1 to 10 µm.

\* \* \* \* \*